US008680520B2

(12) United States Patent
Yamazaki et al.

(10) Patent No.: US 8,680,520 B2
(45) Date of Patent: Mar. 25, 2014

(54) SEMICONDUCTOR DEVICE

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 321 days.

(21) Appl. No.: 12/949,631

(22) Filed: Nov. 18, 2010

(65) Prior Publication Data

US 2011/0121285 A1    May 26, 2011

(30) Foreign Application Priority Data

Nov. 20, 2009 (JP) .................................. 2009-264552

(51) Int. Cl.
*H01L 29/12* (2006.01)
(52) U.S. Cl.
USPC ............................................................ 257/43
(58) Field of Classification Search
USPC ............................................................ 257/43
See application file for complete search history.

(56) References Cited

U.S. PATENT DOCUMENTS

| | | |
|---|---|---|
| 4,466,081 A | 8/1984 | Masuoka |
| 4,902,637 A | 2/1990 | Kondou et al. |
| 4,920,391 A | 4/1990 | Uchida |
| 5,366,922 A | 11/1994 | Aoki et al. |
| 5,731,856 A | 3/1998 | Kim et al. |
| 5,744,864 A | 4/1998 | Cillessen et al. |
| 5,796,650 A | 8/1998 | Wik et al. |
| 5,851,866 A | 12/1998 | Son |
| 5,936,881 A | 8/1999 | Kawashima et al. |
| 6,127,702 A | 10/2000 | Yamazaki et al. |
| 6,198,652 B1 | 3/2001 | Kawakubo et al. |
| 6,266,269 B1 | 7/2001 | Karp et al. |
| 6,294,274 B1 | 9/2001 | Kawazoe et al. |
| 6,445,026 B1 | 9/2002 | Kubota et al. |
| 6,515,511 B2 | 2/2003 | Sugibayashi et al. |
| 6,563,174 B2 | 5/2003 | Kawasaki et al. |
| 6,628,551 B2 | 9/2003 | Jain |

(Continued)

FOREIGN PATENT DOCUMENTS

CN    1695254 A    11/2005
EP    1 498 955 A1    1/2005

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Matthew W Such
*Assistant Examiner* — Robert Carpenter
(74) *Attorney, Agent, or Firm* — Fish & Richardson P.C.

(57) ABSTRACT

It is an object to provide a semiconductor device with a novel structure. The semiconductor device includes a first wiring, a second wiring, a third wiring, a fourth wiring, a first transistor including a first gate electrode, a first source electrode, and a first drain electrode, and a second transistor including a second gate electrode, a second source electrode, and a second drain electrode. The first transistor is provided over a substrate including a semiconductor material, and the second transistor includes an oxide semiconductor layer.

36 Claims, 20 Drawing Sheets

(56) References Cited

U.S. PATENT DOCUMENTS

| | | |
|---|---|---|
| 6,727,522 B1 | 4/2004 | Kawasaki et al. |
| 6,787,835 B2 * | 9/2004 | Atwood et al. ............... 257/296 |
| 6,808,971 B2 | 10/2004 | Bhattacharyya |
| 6,876,045 B2 | 4/2005 | Takagi |
| 6,989,569 B1 | 1/2006 | Hiramoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,483,013 B2 | 1/2009 | Osame |
| 7,501,293 B2 | 3/2009 | Ito et al. |
| 7,601,984 B2 | 10/2009 | Sano et al. |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,791,074 B2 | 9/2010 | Iwasaki |
| 8,212,248 B2 | 7/2012 | Itagaki et al. |
| 8,384,077 B2 | 2/2013 | Yano et al. |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0197794 A1 | 12/2002 | Lee |
| 2003/0189401 A1 | 10/2003 | Kido et al. |
| 2003/0209739 A1 | 11/2003 | Hisamoto et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0151276 A1 | 7/2005 | Jang et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262483 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203454 A1 | 8/2008 | Asami |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0008638 A1 | 1/2009 | Kang et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0110145 A1 | 5/2011 | Yamazaki et al. |
| 2011/0121286 A1 | 5/2011 | Yamazaki et al. |
| 2011/0122673 A1 | 5/2011 | Kamata et al. |
| 2011/0134683 A1 | 6/2011 | Yamazaki et al. |
| 2011/0177696 A1 | 7/2011 | Yano et al. |

FOREIGN PATENT DOCUMENTS

| | | |
|---|---|---|
| EP | 1 737 044 A1 | 12/2006 |
| EP | 2 226 847 A2 | 9/2010 |
| JP | 47-016085 A | 8/1972 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-356370 A | 12/2001 |
| JP | 2002-076356 A | 3/2002 |
| JP | 2002-289859 A | 10/2002 |
| JP | 2002-368226 A | 12/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |
| WO | 2007/029844 A1 | 3/2007 |
| WO | 2009/087943 A1 | 7/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," SID Digest '09 : SID International Symposium Digest of Technical Papers, May 31, 2009, pp. 1110-1112.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H., "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel, YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

(56) References Cited

OTHER PUBLICATIONS

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Bryan Atwood et al.; "SESO Memory: A CMOS compatible high density embedded memory technology for mobile applications"; 2002 Symposium on VLSI Circuits Digest of Technical Papers; 2002; pp. 154-155.

Tomoyuki Ishii et al.; "SESO Memory: A 3T Gain Cell Solution Using Ultra Thin Silicon Film for Dense and Low Power Embedded Memories"; IEEE 2004 Custom Integrated Circuits Conference; pp. 457-463.

International Search Report (International Application No. PCT/JP2010/069652) dated Feb. 8, 2011, 4 pages.

Written Opinion (International Application No. PCT/JP2010/069652) dated Feb. 8, 2011, 6 pages.

Minkyu Kim et al.; "High mobility bottom gate InGaZnO thin film transistors with SiOx etch stopper"; Applied Physics Letters; May 24, 2007; pp. 212114-1-212114-3; vol. 90, No. 21.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931, vol. 41, No. 6.

Chinese Office Action (Application No. 201080052905.3) dated Dec. 30, 2013 with English translation, 21 pages.

* cited by examiner

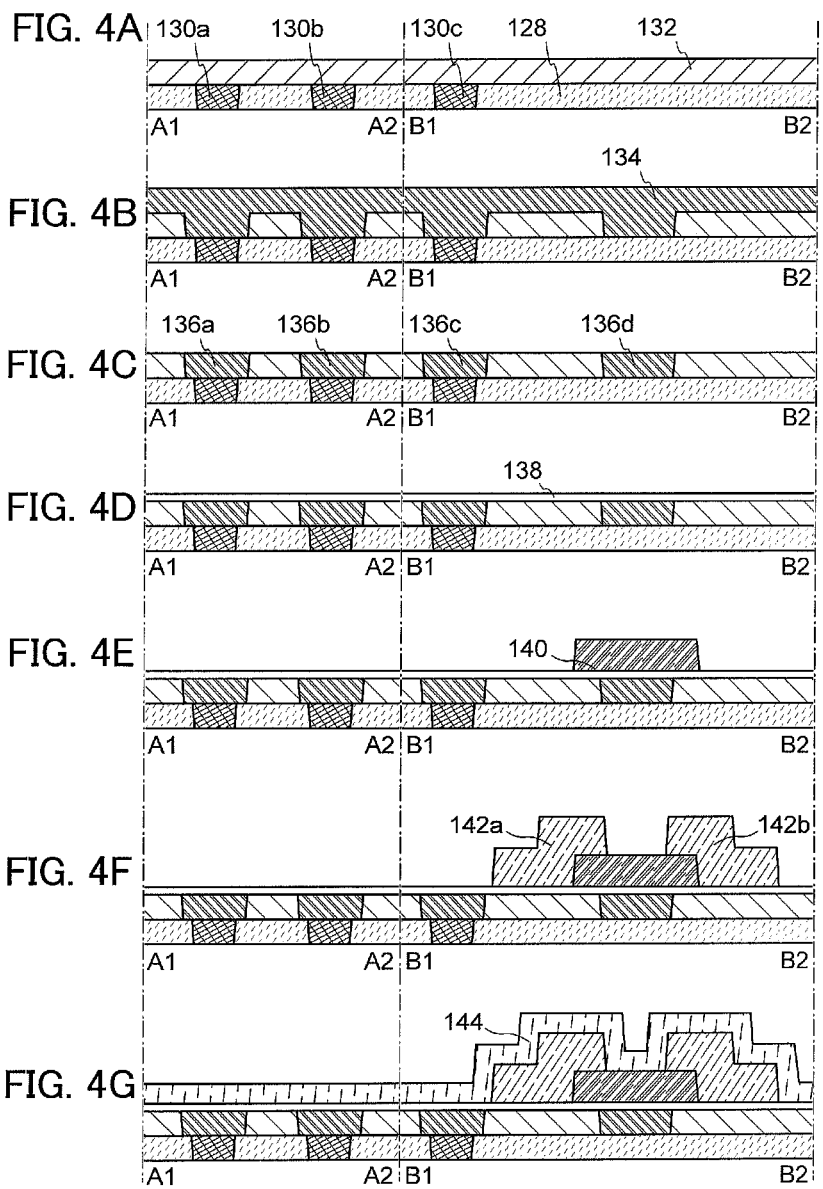

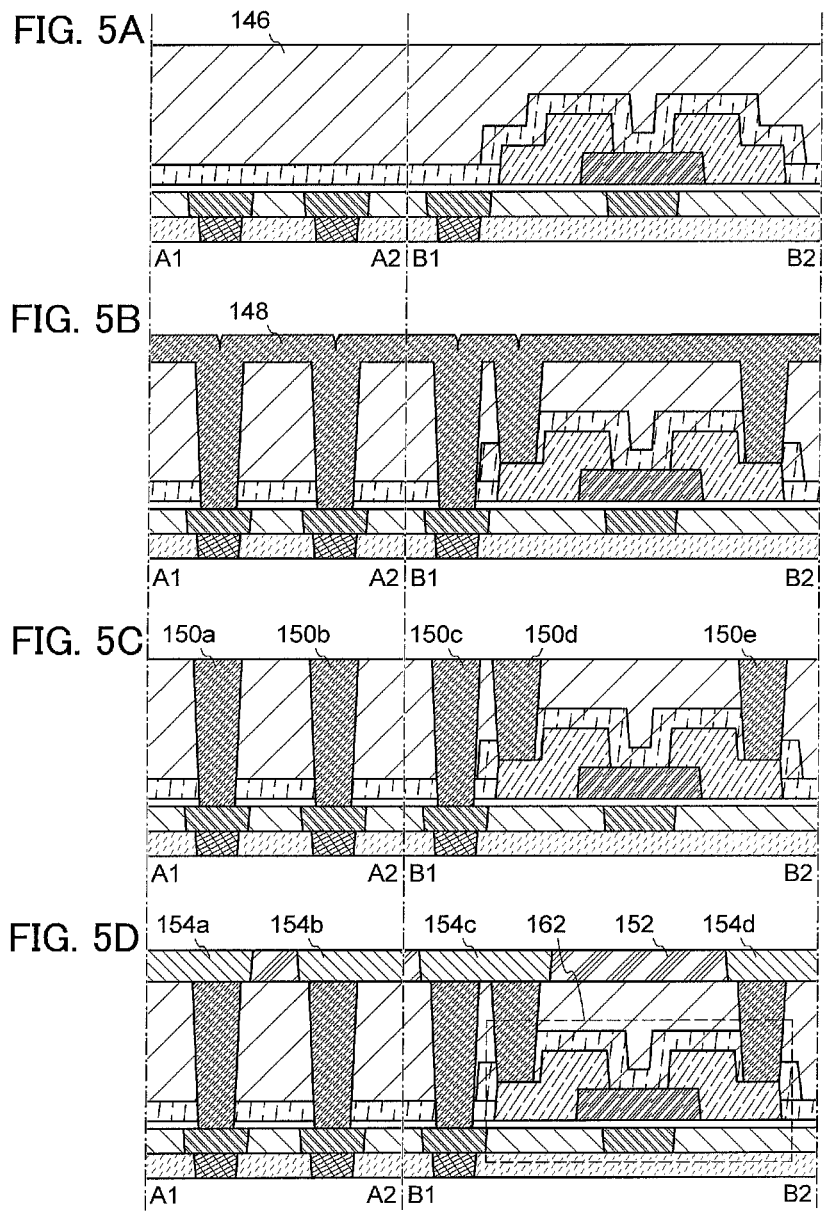

Energy band diagram of B-B' section ($V_G > 0$)

Energy band diagram of B-B' section ($V_G < 0$)

SEMICONDUCTOR DEVICE

TECHNICAL FIELD

The invention disclosed herein relates to a semiconductor device using a semiconductor element and a method for manufacturing the semiconductor device.

BACKGROUND ART

Storage devices using semiconductor elements are broadly classified into two categories: a volatile storage device that loses stored data when power supply stops, and a non-volatile storage device that retains stored data even when power is not supplied.

A typical example of a volatile storage device is a DRAM (dynamic random access memory). A DRAM stores data in such a manner that a transistor included in a storage element is selected and electric charge is stored in a capacitor.

Owing to the above-described principle, charge in a capacitor is lost when data is read out in a DRAM; thus, it is necessary to perform writing again so that data is stored again after reading data. Moreover, a transistor included in a storage element has a leakage current and electric charge flows into or out of a capacitor even when the transistor is not selected, so that the data holding time is short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for holding electric charge in the floating gate or removing the electric charge. Further, it takes a relatively long time to hold or remove electric charge, and it is not easy to perform writing and erasing at higher speed.

REFERENCE

Patent Document

Patent Document 1: Japanese Published Patent Application No. S57-105889

DISCLOSURE OF INVENTION

In view of the foregoing problems, an object of one embodiment of the invention disclosed herein is to provide a semiconductor device with a novel structure in which stored data can be retained even when power is not supplied and the number of times of writing is not limited.

One embodiment of the present invention is a semiconductor device having a layered structure of a transistor formed using an oxide semiconductor and a transistor formed using a material other than the oxide semiconductor. The following structures can be employed, for example.

An embodiment of the present invention is a semiconductor device including a source line, a bit line, a signal line, and a word line. A plurality of memory cells are connected to each other in parallel between the source line and the bit line, and one of the plurality of memory cells includes a first transistor including a first gate electrode, a first source electrode, and a first drain electrode, a second transistor including a second gate electrode, a second source electrode, and a second drain electrode, and a capacitor. The first transistor is provided over a substrate containing a semiconductor material, and the second transistor includes an oxide semiconductor layer. The first gate electrode, one of the second source electrode and the second drain electrode, and one electrode of the capacitor are electrically connected to one another. The source line and one of the first source electrode and the first drain electrode are electrically connected to each other. The bit line and the other of the first source electrode and the first drain electrode are electrically connected to each other. The signal line and the second gate electrode are electrically connected to each other. The word line, the other of the second source electrode and the second drain electrode, and the other electrode of the capacitor are electrically connected to one another.

Another embodiment of the present invention is a semiconductor device including a source line, a bit line, a signal line, and a word line. A plurality of memory cells are connected to each other in parallel between the source line and the bit line, and one of the plurality of memory cells includes a first transistor including a first gate electrode, a first source electrode, and a first drain electrode, a second transistor including a second gate electrode, a second source electrode, and a second drain electrode, and a capacitor. The first transistor is provided over a substrate containing a semiconductor material, and the second transistor includes an oxide semiconductor layer. The first gate electrode, one of the second source electrode and the second drain electrode, and one electrode of the capacitor are electrically connected to one another. The source line and one of the first source electrode and the first drain electrode are electrically connected to each other. The bit line and the other of the first source electrode and the first drain electrode are electrically connected to each other. The signal line and the other of the second source electrode and the second drain electrode are electrically connected to each other. The word line, the second gate electrode, and the other electrode of the capacitor are electrically connected to one another.

In description above, the first transistor in the semiconductor device including a channel formation region provided in the substrate including the semiconductor material, impurity regions provided so as to sandwich the channel formation region, a first gate insulating layer over the channel formation region, the first gate electrode over the first gate insulating layer, and the first source electrode and the first drain electrode electrically connected to the impurity regions.

In description above, the second transistor includes the second gate electrode over the substrate including the semiconductor material, a second gate insulating layer over the second gate electrode, the oxide semiconductor layer over the second gate insulating layer, and the second source electrode and the second drain electrode electrically connected to the oxide semiconductor layer.

In description above, a single crystal semiconductor substrate or an SOI substrate is preferably used as the substrate including the semiconductor material. In particular, silicon is preferably used as the semiconductor material.

In description above, the oxide semiconductor layer is preferably formed using an In—Ga—Zn—O-based oxide semiconductor material. More preferably, the oxide semiconductor layer includes a crystal of $In_2Ga_2ZnO_7$. Moreover, the concentration of hydrogen in the oxide semiconductor layer is preferably less than or equal to $5 \times 10^{19}$ atoms/cm$^3$. In addition, the off-state current of the second transistor is preferably less than or equal to $1 \times 10^{-13}$ A.

In any of the above structures, the second transistor can be provided in a region overlapping with the first transistor.

Note that in this specification and the like, the term such as "over" or "below" does not necessarily mean that a component is placed "directly on" or "directly under" another component. For example, the expression "a first gate electrode over a gate insulating layer" does not exclude the case where a component is placed between the gate insulating layer and the first gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

In general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. A substrate in the "SOI substrate" is not limited to a semiconductor substrate such as a silicon wafer and can be a non-semiconductor substrate such as a glass substrate, a quartz substrate, a sapphire substrate, or a metal substrate. In other words, the "SOI substrate" also includes an insulating substrate such as a non-semiconductor substrate, over which a semiconductor layer is provided with an insulating layer interposed therebetween. In addition, in this specification and the like, the term "semiconductor substrate" means not only a substrate formed using only a semiconductor material but also all substrates including a semiconductor material. That is, in this specification and the like, the "SOI substrate" is also included in the category of the "semiconductor substrate".

Moreover, in this specification and the like, a material other than an oxide semiconductor may be any semiconductor material as long as it is a material other than an oxide semiconductor. For example, silicon, germanium, silicon germanium, silicon carbide, gallium arsenide, or the like can be given. Besides, an organic semiconductor material and the like can be used. Note that in the case where a material included in a semiconductor device and the like is not particularly explained, an oxide semiconductor material or a material other than an oxide semiconductor may be used.

One embodiment of the present invention provides a semiconductor device in which a transistor which uses a material other than an oxide semiconductor is placed in a lower portion and a transistor including an oxide semiconductor is placed in an upper portion.

Since the off-state current of a transistor including an oxide semiconductor is extremely low, stored data can be stored for an extremely long time by using the transistor. In other words, power consumption can be adequately reduced because refresh operation becomes unnecessary or the frequency of refresh operation can be extremely low. Moreover, stored data can be stored for a long time even when power is not supplied.

In addition, high voltage is not needed for writing information in the semiconductor device and there is no problem of deterioration of elements. For example, since there is no need to perform injection of electrons to a floating gate and extraction of electrons from the floating gate which are needed in a conventional nonvolatile memory, deterioration of a gate insulating layer does not occur. That is, the semiconductor device according to one embodiment of the present invention does not have a limit on the number of times of writing which is a problem in a conventional nonvolatile memory, and reliability thereof is drastically improved. Further, information is written according to an on state and an off state of the transistor, whereby high-speed operation can be easily realized. Additionally, there is an advantage that operation for erasing information, which is necessary in a flash memory and the like, is not needed.

Since a transistor which uses a material other than an oxide semiconductor can operate at sufficiently high speed, stored data can be read out at high speed by using the transistor.

A semiconductor device with a novel feature can be realized by including both the transistor which uses a material other than an oxide semiconductor and the transistor which uses an oxide semiconductor.

BRIEF DESCRIPTION OF DRAWINGS

In the accompanying drawings:

FIGS. 4A to 4G are cross-sectional views for illustrating manufacturing steps of a semiconductor device;

FIGS. 5A to 5D are cross-sectional views for illustrating manufacturing steps of a semiconductor device;

BEST MODE FOR CARRYING OUT THE INVENTION

Figure 1:
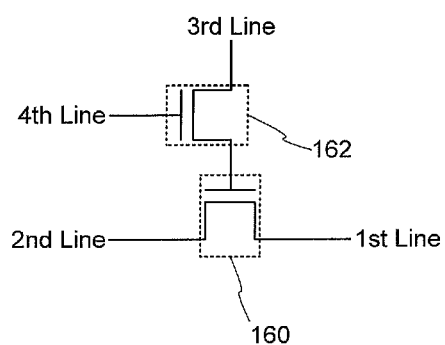
FIG. 1 is a circuit diagram for illustrating a semiconductor device.

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, the size, the range, or the like of each structure illustrated in drawings and the like is not accurately represented in some cases for easy understanding. Therefore, embodiments of the present invention are not necessarily limited to such a position, size, range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, structures and manufacturing methods of semiconductor devices according to one embodiment of the disclosed invention are described with reference to FIG. 1, FIGS. 2A and 2B, FIGS. 3A to 3H, FIGS. 4A to 4G, FIGS. 5A to 5D, FIG. 6, FIG. 7, FIGS. 8A and 8B, FIG. 9, FIG. 10, FIG. 11, FIG. 12, FIGS. 13A and 13B, FIGS. 14A and 14B, and FIGS. 15A and 15B.

<Circuit Structure of Semiconductor Device>

FIG. 1 illustrates an example of a circuit structure of a semiconductor device. The semiconductor device includes a transistor 160 which uses a material other than an oxide semiconductor and a transistor 162 which uses an oxide semiconductor.

Here, a gate electrode of the transistor 160 is electrically connected to one of a source electrode and a drain electrode of the transistor 162. A first wiring (which is denoted as "1st Line" and also called a source line) and a second wiring (which is denoted as "2nd Line" and also called a bit line) are electrically connected to a source electrode of the transistor 160 and a drain electrode of the transistor 160, respectively. Further, a third wiring (which is denoted as "3rd Line" and also called a first signal line) and a fourth wiring (which is denoted as "4th Line" and also called a second signal line) are electrically connected to the other of the source electrode and the drain electrode of the transistor 162 and a gate electrode of the transistor 162, respectively.

The transistor 160 which uses a material other than an oxide semiconductor can operate at a speed much higher than a transistor which uses an oxide semiconductor, and thus realizes high-speed reading of stored data and the like. In addition, off-state current is extremely small in the transistor 162 which uses an oxide semiconductor. Therefore, when the transistor 162 is turned off, a potential of the gate electrode of the transistor 160 can be held for an extremely long time.

The advantage that the potential of the gate electrode can be held for an extremely long time enables writing, holding, and reading of information to be performed as described below.

Description is made on writing and holding of information first. First, a potential of the fourth wiring is set to be a potential to make the transistor 162 be in an on state, whereby the transistor 162 is made to be in an on state. Accordingly, a potential of the third wiring is applied to the gate electrode of the transistor 160 (writing of information). After that, the potential of the fourth wiring is set to be a potential to make the transistor 162 be in an off state, whereby the transistor 162 is made to be in an off state; accordingly, the potential of the gate electrode of the transistor 160 is held (holding of the information).

Since the off-state current of the transistor 162 is extremely small, the potential of the gate electrode of the transistor 160 is held for a long time. For example, when the potential of the gate electrode of the transistor 160 is a potential to make the transistor 160 be in an on state, an on state of the transistor 160 is kept for a long time. When the potential of the gate electrode of the transistor 160 is a potential to make the transistor 160 be in an off state, an off state of the transistor 160 is kept for a long time.

Next, description is made on reading of information. When an on state or an off state of the transistor 160 is kept as described above and a predetermined potential (a low potential) is applied to the first wiring, a value of a potential of the second wiring varies depending on a state of the transistor 160 which is an on state or an off state. For example, when the transistor 160 is in an on state, the potential of the second wiring is lowered by being affected by the potential of the first wiring. On the other hand, when the transistor 160 is in an off state, the potential of the second wiring is not changed.

In this manner, by comparing the potential of the first wiring with the potential of the second wiring in a state where information is held, the information can be read.

Then, description is made on rewriting of information. Rewriting of information is performed in a manner similar to that of the writing and holding of information which are described above. That is, the potential of the fourth wiring is set to be a potential to make the transistor 162 be in an on state, whereby the transistor 162 is made to be in an on state. Accordingly, the potential of the third wiring (a potential relating to new information) is applied to the gate electrode of the transistor 160. After that, the potential of the fourth wiring is set to be a potential to make the transistor 162 be in an off state, whereby the transistor 162 is made to be in an off state; accordingly, the new information is held.

As described above, in the semiconductor device according to one embodiment of the disclosed invention, information can be directly rewritten by performing writing of information again Erasing operation which is necessary in a flash memory and the like is thus not needed; therefore, reduction in operation speed due to erasing operation can be suppressed. In other words, high-speed operation of a semiconductor device is realized.

Note that, in the above description, an n-type transistor (an n-channel transistor) using electrons as carriers is used; however, a p-channel transistor using holes as carriers, needless to say, can be used instead of an n-channel transistor.

<Plan Structure and Cross-Sectional Structure of Semiconductor Device>

Figure 2A:
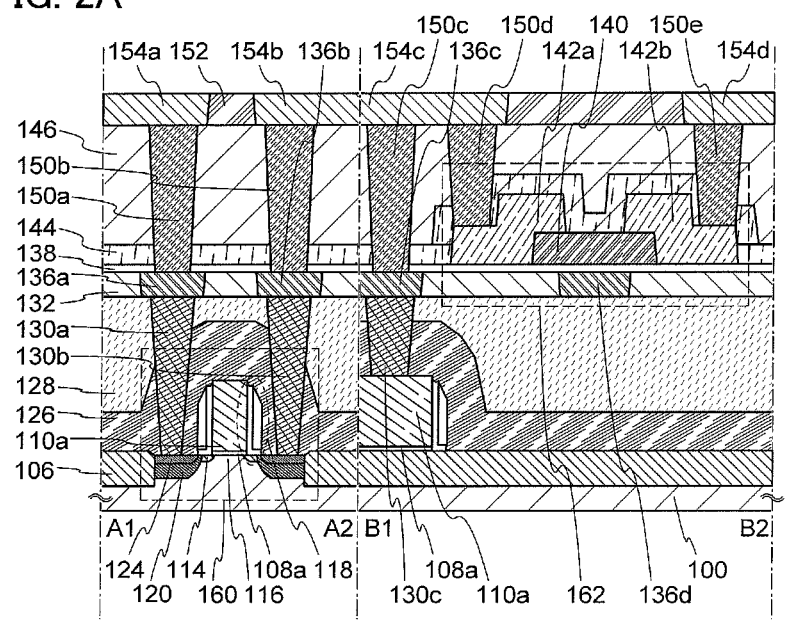
FIGS. 2A and 2B are a cross-sectional view and a plan view for illustrating a semiconductor device.
Figure 2B:
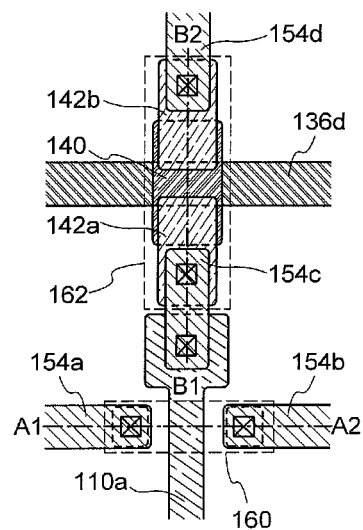

An example of a structure of the above semiconductor device is illustrated in FIGS. 2A and 2B. FIGS. 2A and 2B are a cross-sectional view of the semiconductor device and a plan view thereof, respectively. Here, FIG. 2A corresponds to a cross-section taken along line A1-A2 and line B1-B2 of FIG. 2B. The semiconductor device illustrated in FIGS. 2A and 2B includes the transistor 160 which uses a material other than an oxide semiconductor in a lower portion and the transistor 162 which uses an oxide semiconductor in an upper portion. Note that although n-channel transistors are described as the transistors 160 and 162, p-channel transistors may be employed. In particular, it is easy to use a p-channel transistor as the transistor 160.

The transistor 160 includes: a channel formation region 116 which is provided for a substrate 100 containing a semiconductor material; impurity regions 114 between which the channel formation region 116 is sandwiched and high-concentration impurity regions 120 between which the channel formation region 116 is sandwiched (which are also collectively called impurity regions); a gate insulating layer 108a provided over the channel formation region 116: a gate electrode 110a provided over the gate insulating layer 108a; and a source or drain electrode 130a and a source or drain electrode 130b which are electrically connected to the impurity regions 114.

Here, sidewall insulating layers 118 are provided for side surfaces of the gate electrode 110a. Further, in regions of the substrate 100 which do not overlap with the sidewall insulating layers 118 when seen in a plan view, the high-concentration impurity regions 120 are provided. Metal compound regions 124 are over the high-concentration impurity regions 120. Over the substrate 100, an element isolation insulating layer 106 is provided so as to surround the transistor 160, and an interlayer insulating layer 126 and an interlayer insulating layer 128 are provided so as to cover the transistor 160. The source or drain electrode 130a and the source or drain electrode 130b are electrically connected to the metal compound regions 124 through openings formed in the interlayer insulating layers 126 and 128. In other words, the source or drain electrode 130a and the source or drain electrode 130b are electrically connected to the high-concentration impurity regions 120 and the impurity regions 114 via the metal compound regions 124. Further, the gate electrode 110a is electrically connected to an electrode 130c which is provided in a similar manner to that of the source or drain electrode 130a and the source or drain electrode 130b.

The transistor 162 includes: a gate electrode 136d provided over the interlayer insulating layer 128; a gate insulating layer 138 provided over the gate electrode 136d; an oxide semiconductor layer 140 provided over the gate insulating layer 138; and a source or drain electrode 142a and a source or drain electrode 142b which are provided over and electrically connected to the oxide semiconductor layer 140.

Here, the gate electrode 136d is provided so as to be embedded in an insulating layer 132 which is formed over the interlayer insulating layer 128. Furthermore, similarly to the gate electrode 136d, an electrode 136a, an electrode 136b, and an electrode 136c are formed in contact with the source or drain electrode 130a, the source or drain electrode 130b, and an electrode 130c, respectively.

Over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142a and the source or drain electrode 142b are formed. In the openings, an electrode 150d and an electrode 150e are formed to be in contact with the source or drain electrode 142a and the source or drain electrode 142b, respectively. Similarly to the electrodes 150d and 150e, an electrode 150a, an electrode 150b, and an electrode 150c are formed to be in contact with the electrode 136a, the electrode 136b, and the electrode 136c, respectively, in openings provided in the gate insulating layer 138, the protective insulating layer 144, and the interlayer insulating layer 146.

Here, the oxide semiconductor layer 140 is preferably an oxide semiconductor layer which is highly purified by removing an impurity such as hydrogen. Specifically, hydrogen concentration in the oxide semiconductor layer 140 is less than or equal to $5 \times 10^{19}$ atoms/cm$^3$, preferably, less than or equal to $5 \times 10^{18}$ atoms/cm$^3$, or more preferably, less than or equal to $5 \times 10^{17}$ atoms/cm$^3$. The oxide semiconductor layer 140 is preferably an oxide semiconductor layer in which defects resulted from oxygen deficiency are reduced by containing sufficient oxygen. In the highly purified oxide semiconductor layer 140 in which the hydrogen concentration is sufficiently reduced and defects resulted from oxygen deficiency are reduced, the carrier concentration is less than or equal to $1 \times 10^{12}$/cm$^3$, preferably, less than or equal to $1 \times 10^{11}$/cm$^3$. In this manner, by using an oxide semiconductor which is made to be an i-type (intrinsic) oxide semiconductor or a substantially i-type oxide semiconductor, the transistor 162 which has extremely favorable off-state current characteristics can be obtained. For example, when a drain voltage $V_d$ is +1 V or +10 V and a gate voltage $V_g$ ranges from −5 V to −20 V, off-state current is less than or equal to $1 \times 10^{-13}$ A. When the highly purified oxide semiconductor layer 140 in which the hydrogen concentration is sufficiently reduced and defects resulted from oxygen deficiency are reduced is used and off-state current of the transistor 162 is reduced, a semiconductor device having a novel structure can be realized. Note that the hydrogen concentration in the oxide semiconductor layer 140 was measured by secondary ion mass spectroscopy (SIMS).

Furthermore, an insulating layer 152 is provided over the interlayer insulating layer 146. An electrode 154a, an electrode 154b, an electrode 154c, and an electrode 154d are provided so as to be embedded in the insulating layer 152. Here, the electrode 154a is in contact with the electrode 150a; the electrode 154b, the electrode 150b; the electrode 154c, the electrodes 150c and 150d; and the electrode 154d, the electrode 150e.

That is, in the semiconductor device illustrated in FIGS. 2A and 2B, the gate electrode 110a of the transistor 160 is electrically connected to the source or drain electrode 142a of the transistor 162 via the electrodes 130c, 136c, 150c, 154c, and 150d.

<Method for Manufacturing Semiconductor Device>

Next, an example of a method for manufacturing the above-described semiconductor device will be described. First, a method for manufacturing the transistor 160 in the lower portion will be described with reference to FIGS. 3A to 3H, and then, a method for manufacturing the transistor 162 in the upper portion will be described with reference to FIGS. 4A to 4G and FIGS. 5A to 5D.

<Method for Manufacturing Transistor in Lower Portion>

Figure 3A:
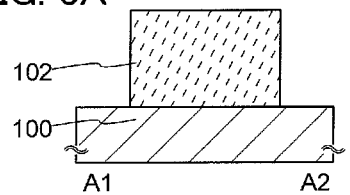
FIGS. 3A to 3H are cross-sectional views for illustrating manufacturing steps of a semiconductor device.
Figure 3E:
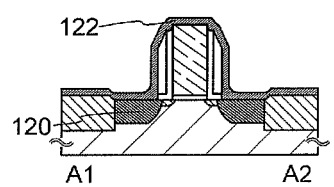

First, the substrate 100 which contains a semiconductor material is prepared (see FIG. 3A). As the substrate 100 which contains a semiconductor material, a single crystal semiconductor substrate or a polycrystalline semiconductor substrate containing silicon, silicon carbide, or the like, a compound semiconductor substrate containing silicon germanium or the like, an SOI substrate, or the like can be used. Here, an example in which a single crystal silicon substrate is used as the substrate 100 which contains a semiconductor material is described. Note that in general, the term "SOI substrate" means a substrate having a silicon semiconductor layer over its insulating surface. In this specification and the like, the term "SOI substrate" also means a substrate having a semiconductor layer using a material other than silicon over its insulating surface. In other words, a semiconductor layer included in the "SOI substrate" is not limited to a silicon semiconductor layer. Examples of the SOI substrate include a substrate which has a semiconductor layer over its insulating substrate such as a glass substrate, with an insulating layer between the semiconductor layer and the insulating substrate.

Over the substrate 100, a protective layer 102 which functions as a mask for forming an element isolation insulating layer (see FIG. 3A). As the protective layer 102, for example, an insulating layer formed using silicon oxide, silicon nitride, silicon nitride oxide, or the like can be used. Note that an impurity element giving n-type conductivity or an impurity element giving p-type conductivity may be added to the substrate 100 before or after the above step so that the threshold voltage of the transistor is controlled. As the impurity giving n-type conductivity, phosphorus, arsenic, or the like can be used when the semiconductor material contained in the substrate 100 is silicon. As the impurity giving p-type conductivity, boron, aluminum, gallium, or the like can be used, for example.

Next, with the use of the above protective layer 102 as a mask, part of the substrate 100 in a region which is not covered with the protective layer 102 (an exposed region) is removed by etching. Thus, an isolated semiconductor region 104 is formed (see FIG. 3B). For the etching, dry etching is preferably performed, but wet etching can be performed. An etching gas and an etchant can be selected as appropriate depending on a material of the object to be etched.

Figure 3B:
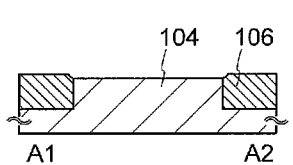
Figure 3F:
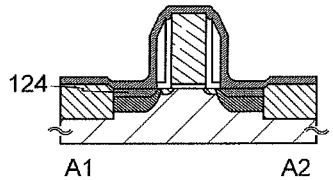

Next, an insulating layer is formed so as to cover the semiconductor region 104 and is selectively removed in a region which overlaps with the semiconductor region 104, whereby the element isolation insulating layer 106 is formed (see FIG. 3B). The insulating layer is formed using silicon oxide, silicon nitride, silicon nitride oxide, or the like. As a method for removing the insulating layer, there are etching treatment and polishing treatment such as CMP, and any of them can be employed. Note that the protective layer 102 is removed either after the semiconductor region 104 is formed or after the element isolation insulating layer 106 is formed.

Then, an insulating layer is formed over the semiconductor region 104 and a layer containing a conductive material is formed over the insulating layer.

The insulating layer serves as a gate insulating layer later and preferably has a single-layer structure or a stacked-layer structure using a film containing silicon oxide, silicon nitride oxide, silicon nitride, hafnium oxide, aluminum oxide, tantalum oxide, or the like which is obtained by a CVD method, a sputtering method, or the like. Alternatively, the above insulating layer may be formed by oxidizing or nitriding a surface of the semiconductor region 104 by high-density plasma treatment or thermal oxidation treatment. The high-density plasma treatment can be performed using, for example, a mixed gas of a rare gas such as helium, argon, krypton, or xenon and a gas such as oxygen, nitrogen oxide, ammonia, nitrogen, or hydrogen. There is no particular limitation on the thickness of the insulating layer, but the thickness can be greater than or equal to 1 nm and less than or equal to 100 nm, for example.

The layer containing a conductive material can be formed using a metal material such as aluminum, copper, titanium, tantalum, or tungsten. Alternatively, the layer containing a conductive material may be formed using a semiconductor material such as polycrystalline silicon containing a conductive material. There is also no particular limitation on a method for forming the layer containing a conductive material, and any of a variety of film formation methods such as an evaporation method, a CVD method, a sputtering method, and a spin coating method is applicable. Note that in this embodiment, an example of the case where the layer containing a conductive material is formed using a metal material is described.

Figure 3C:
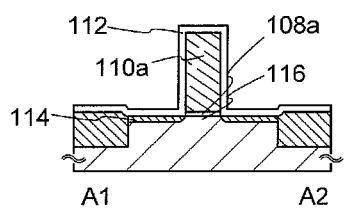

After that, by selectively etching the insulating layer and the layer containing a conductive material, the gate insulating layer 108a and the gate electrode 110a are formed (see FIG. 3C).

Next, an insulating layer 112 which covers the gate electrode 110a is formed (see FIG. 3C). Phosphorus (P), arsenic (As), or the like is then added to the semiconductor region 104, whereby the impurity regions 114 with a shallow junction depth are formed (see FIG. 3C). Note that although phosphorus or arsenic is added here so that an n-channel transistor is formed, an impurity element such as boron (B) or aluminum (Al) may be added in the case of forming a p-channel transistor. Note also that the channel formation region 116 is formed in the semiconductor region 104 under the gate insulating layer 108a by formation of the impurity regions 114 (see FIG. 3C). Here, the concentration of the added impurity can be set as appropriate; in the case where a semiconductor element is highly miniaturized, the concentration is preferably set to be high. Further, a process in which the insulating layer 112 is formed after formation of the impurity regions 114 may be employed instead of the process employed here in which the impurity regions 114 are formed after formation of the insulating layer 112.

Figure 3G:
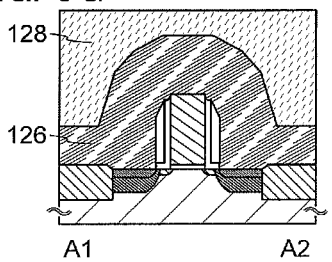
Figure 3D:
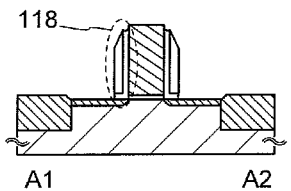

Then, the sidewall insulating layers 118 are formed (see FIG. 3D). An insulating layer is formed so as to cover the insulating layer 112 and then is subjected to highly anisotropic etching treatment, whereby the sidewall insulating layers 118 can be formed in a self-aligned manner. It is preferable that the insulating layer 112 be partly etched at this time so that a top surface of the gate electrode 110a and top surfaces of the impurity regions 114 are exposed.

After that, an insulating layer is formed so as to cover the gate electrode 110a, the impurity regions 114, the side wall insulating layers 118, and the like. Phosphorus (P), arsenic (As), or the like is then added to regions where the insulating layer is in contact with the impurity regions 114, whereby the high-concentration impurity regions 120 are formed (see FIG. 3E). Next, the above insulating layer is removed and a metal layer 122 is formed so as to cover the gate electrode 110a, the sidewall insulating layers 118, the high-concentration impurity regions 120, and the like (see FIG. 3E). Any of a variety of methods such as a vacuum evaporation method, a sputtering method, and a spin coating method is applicable to formation of the metal layer 122. It is preferable that the metal layer 122 be formed using a metal material that reacts with a semiconductor material contained in the semiconductor region 104 so as to form a metal compound having low resistance. Examples of such a metal material include titanium, tantalum, tungsten, nickel, cobalt, and platinum.

Next, heat treatment is performed, whereby the metal layer 122 reacts with the semiconductor material. Accordingly, the metal compound regions 124 which are in contact with the high-concentration impurity regions 120 are formed (see FIG. 3F). Note that, in the case of using polycrystalline silicon for the gate electrode 110a, a portion of the gate electrode 110a which is in contact with the metal layer 122 also has the metal compound region.

As the heat treatment, irradiation with a flash lamp can be employed. Although it is needless to say that another heat treatment method may be used, a method by which heat treatment for an extremely short time can be achieved is preferably used in order to improve the controllability of chemical reaction in formation of the metal compound. Note that the above metal compound regions are formed through reaction of the metal material with the semiconductor material and have conductivity which is sufficiently increased. By formation of the metal compound regions, electric resistance can be sufficiently reduced and element characteristics can be improved. The metal layer 122 is removed after formation of the metal compound regions 124.

The interlayer insulating layers 126 and 128 are formed so as to cover the components formed in the above steps (see FIG. 3G). The interlayer insulating layers 126 and 128 can be formed using a material containing an inorganic insulating material such as silicon oxide, silicon nitride oxide, silicon nitride, hafnium oxide, aluminum oxide, or tantalum oxide. Alternatively, an organic insulating material such as polyimide or acrylic can be used. Note that although the interlayer insulating layer 126 and the interlayer insulating layer 128 form a two-layer structure here, the structure of the interlayer insulating layers is not limited to this. Note also that a surface of the interlayer insulating layer 128 is preferably subjected to CMP, etching, or the like so as to be flattened after the interlayer insulating layer 128 is formed.

Figure 3H:
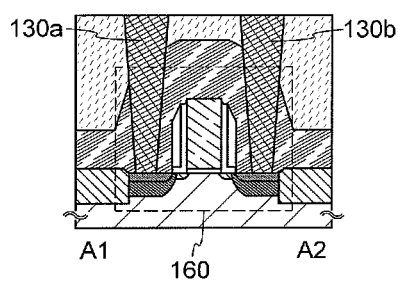

After that, openings reaching the metal compound regions 124 are formed in the interlayer insulating layers, and then the source or drain electrode 130a and the source or drain electrode 130b are formed in the openings (see FIG. 3H). For example, the source or drain electrode 130a and the source or drain electrode 130b can be formed as follows: a conductive layer is formed in a region including the openings by a PVD method, a CVD method, or the like; and then, part of the conductive layer is removed by etching, CMP, or the like.

Note that in the case of forming the source or drain electrode 130a and the source or drain electrode 130b by removing part of the conductive layer, surfaces thereof are preferably processed to be flat. For example, in the case where a titanium film, a titanium nitride film, or the like is formed to have a small thickness in the region including the openings and a tungsten film is then formed so as to be embedded in the openings, CMP which is performed after that can remove an unnecessary portion of the tungsten film, titanium film, titanium nitride film, or the like, and improve the flatness of the surfaces. By flattening surfaces including the surfaces of the source or drain electrode 130a and the source or drain electrode 130b as described above, favorable electrodes, wirings, insulating layers, semiconductor layers, or the like can be formed in a later step.

Note that although only the source or drain electrode 130a and the source or drain electrode 130b which are in contact with the metal compound regions 124 are described, an electrode which is in contact with the gate electrode 110a (e.g., the electrode 130c of FIG. 2A) and the like can be formed in the same step. There is no particular limitation on a material used for the source or drain electrode 130a and the source or drain electrode 130b and any of a variety of conductive materials can be used. For example, a conductive material such as molybdenum, titanium, chromium, tantalum, tungsten, aluminum, copper, neodymium, or scandium can be used.

Through the above process, the transistor 160 which uses the substrate 100 containing a semiconductor material is formed. Note that electrodes, wirings, insulating layers, or the like may be formed as well after the above process is performed. When a multilayer wiring structure in which an interlayer insulating layer and a conductive layer are stacked is employed as a wiring structure, a highly-integrated semiconductor device can be provided.

<Method for Manufacturing Transistor in Upper Portion>

Then, a process through which the transistor 162 is manufactured over the interlayer insulating layer 128 is described with reference to FIGS. 4A to 4G and FIGS. 5A to 5D. Note that the transistor 160 and the like below the transistor 162 are omitted in FIGS. 4A to 4G and FIGS. 5A to 5D, which illustrate a manufacturing process of a variety of electrodes over the interlayer insulating layer 128, the transistor 162, and the like.

First, the insulating layer 132 is formed over the interlayer insulating layer 128, the source or drain electrode 130a, the source or drain electrode 130b, and the electrode 130c (see FIG. 4A). The insulating layer 132 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the insulating layer 132.

Next, openings reaching the source or drain electrode 130a, the source or drain electrode 130b, and the electrode 130c are formed in the insulating layer 132. At this time, another opening is formed in a region where the gate electrode 136d is to be formed. A conductive layer 134 is formed so as to be embedded in the openings (see FIG. 4B). The above openings can be formed by etching with the use of a mask, for example. The mask can be formed by exposure using a photomask, for example. For the etching, either wet etching or dry etching may be performed but dry etching is preferable in view of the fine patterning. The conductive layer 134 can be formed by a deposition method such as a PVD method or a CVD method. Examples of a material for the conductive layer 134 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 134 can be formed as follows: a titanium film is formed to have a small thickness by a PVD method in a region including the openings and a titanium nitride film is then formed to have a small thickness by a CVD method; and then, a tungsten film is formed so as to be embedded in the openings. Here, the titanium film formed by a PVD method has a function of reducing an oxide film at an interface with a lower electrode (here, the source or drain electrode 130a, the source or drain electrode 130b, the electrode 130c, or the like) so that contact resistance with the lower electrode is reduced. In addition, the subsequently formed titanium nitride film has a barrier property such that diffusion of a conductive material is prevented. Further, after a barrier film is formed using titanium, titanium nitride, or the like, a copper film may be formed by a plating method.

After the conductive layer 134 is formed, part of the conductive layer 134 is removed by etching, CMP, or the like so that the insulating layer 132 is exposed and the electrodes 136a, 136b, and 136c, and the gate electrode 136d are formed (see FIG. 4C). Note that when the electrodes 136a, 136b, and 136c, and the gate electrode 136d are formed by removing part of the above conductive layer 134, processing is preferably performed so that flattened surfaces are obtained. By flattening surfaces of the insulating layer 132, the electrodes 136a, 136b, and 136c, and the gate electrode 136d, favorable electrodes, wirings, insulating layers, semiconductor layers or the like can be formed in a later step.

After that, the gate insulating layer 138 is formed so as to cover the insulating layer 132, the electrodes 136a, 136b, and 136c, and the gate electrode 136d (see FIG. 4D). The gate insulating layer 138 can be formed by a sputtering method, a CVD method, or the like. The gate insulating layer 138 preferably contains silicon oxide, silicon nitride, silicon oxynitride, silicon nitride oxide, aluminum oxide, hafnium oxide, tantalum oxide, or the like. Note that the gate insulating layer 138 may have a single-layer structure or a stacked-layer structure. For example, the gate insulating layer 138 of silicon oxynitride can be formed by a plasma CVD method using silane ($SiH_4$), oxygen, and nitrogen as source gases. There is no particular limitation on the thickness of the gate insulating layer 138, but the thickness can be greater than or equal to 10 nm and less than or equal to 500 nm, for example. When a stacked-layer structure is employed, the gate insulating layer 138 is preferably formed by stacking a first gate insulating layer with a thickness greater than or equal to 50 nm and less than or equal to 200 nm and a second gate insulating layer with a thickness greater than or equal to 5 nm and less than or equal to 300 nm over the first gate insulating layer.

Note that an oxide semiconductor which is made to be an i-type oxide semiconductor or a substantially i-type oxide semiconductor by removing an impurity (an oxide semiconductor which is highly purified) is extremely sensitive to an interface state or an interface electric charge; therefore, when such an oxide semiconductor is used for an oxide semiconductor layer, an interface between the oxide semiconductor layer and a gate insulating layer is important. In other words, the gate insulating layer 138 which is to be in contact with the highly purified oxide semiconductor layer needs to have high quality.

For example, a high-density plasma CVD method using microwave (2.45 GHz) is favorable because the dense and high-quality gate insulating layer 138 having high withstand voltage can be formed thereby. In this manner, an interface state can be reduced and interface characteristics can be favorable when the highly purified oxide semiconductor layer and the high quality gate insulating layer are in contact with each other.

Needless to say, even when such a highly purified oxide semiconductor layer is used, another method such as a sputtering method or a plasma CVD method can be employed as long as an insulating layer having good quality can be formed as the gate insulating layer. Alternatively, an insulating layer whose film quality and interface characteristics with the oxide semiconductor layer are modified by heat treatment after being formed may be applied. In any case, a layer is acceptable which is of good quality as the gate insulating layer 138, and which reduces interface state density between the gate insulating layer and the oxide semiconductor layer so that a good interface is formed.

Moreover, when an impurity is contained in an oxide semiconductor, in the bias temperature test (the BT test) at 85° C. for 12 hours with electric field strength of $2\times10^6$ V/cm, a bond between the impurity and the main component of the oxide semiconductor is cut by a strong electric field (B: bias) and a high temperature (T: temperature), and a generated dangling bond leads to a shift in the threshold voltage ($V_{th}$).

On the other hand, according to one embodiment of the disclosed invention, a transistor which is stable even in the BT test can be provided by removing an impurity in the oxide semiconductor, especially hydrogen or water, and realizing good interface characteristics between the gate insulating layer and the oxide semiconductor layer as described above.

Then, an oxide semiconductor layer is formed over the gate insulating layer 138 and processed by a method such as etching using a mask so that the oxide semiconductor layer 140 having an island-shape is formed (see FIG. 4E).

As the oxide semiconductor layer, it is preferable to use an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer, which is preferably amorphous in particular. In this embodiment, as the oxide semiconductor layer, an amorphous oxide semiconductor layer is formed by a sputtering method with the use of an In—Ga—Zn—O-based oxide semiconductor target for film formation. Note that by adding silicon to the amorphous oxide semiconductor layer, crystallization can be suppressed; therefore, the oxide semiconductor layer may be formed using a target which contains $SiO_2$ at greater than or equal to 2 wt. % and less than or equal to 10 wt. %.

As a target for forming the oxide semiconductor layer with a sputtering method, a metal oxide target containing zinc oxide as its main component can be used, for example. Moreover, a target for depositing an oxide semiconductor including In, Ga, and Zn (a composition ratio of $In_2O_3$:$Ga_2O_3$:ZnO=1:1:1 [molar ratio] or In:Ga:Zn=1:1:0.5 [atomic ratio]), or the like can be used, for example. Furthermore, a target for depositing an oxide semiconductor including In, Ga, and Zn (having a composition ratio of In:Ga:Zn=1:1:1 [atomic ratio] or a composition ratio of In:Ga:Zn=1:1:2 [atomic ratio]) may be used. The filling rate of a target for depositing an oxide semiconductor is greater than or equal to 90% and less than or equal to 100%, preferably greater than or equal to 95% (e.g., 99.9%). By using a target for depositing an oxide semiconductor whose filling rate is high, a dense oxide semiconductor layer is formed.

An atmosphere for formation of the oxide semiconductor layer is preferably a rare gas (typically argon) atmosphere, an oxygen atmosphere, or a mixed atmosphere of a rare gas (typically argon) and oxygen. Specifically, a high-purity gas is preferable in which the concentration of impurities such as hydrogen, water, hydroxyl, and hydride is reduced to approximately several parts per million (preferably several parts per billion).

At the time of forming the oxide semiconductor layer, the substrate is fixed in a treatment chamber which is kept in a reduced-pressure state and the substrate temperature is higher than or equal to 100° C. and lower than or equal to 600° C., preferably, higher than or equal to 200° C. and lower than or equal to 400° C. When the oxide semiconductor layer is formed while the substrate is heated, the concentration of impurities contained in the oxide semiconductor layer can be reduced. In addition, damage due to sputtering is reduced. While moisture remaining in the treatment chamber is removed, a sputtering gas from which hydrogen and moisture are removed is introduced, and the oxide semiconductor layer is formed with use of metal oxide as a target. In order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. A hydrogen atom, a compound containing a hydrogen atom, such as water ($H_2O$), (preferably a compound containing a carbon atom), or the like is removed from the deposition chamber which is evacuated with the cryopump, whereby the concentration of impurities contained in the oxide semiconductor layer formed in the deposition chamber can be reduced.

For example, the deposition conditions can be set as follows: the distance between a substrate and a target is 100 mm; the pressure is 0.6 Pa; the direct-current (DC) power is 0.5 kW; and the atmosphere is an oxygen atmosphere (the proportion of the oxygen flow rate is 100%). It is preferable that a pulsed direct-current (DC) power supply be used because powder substances (also referred to as particles or dust) can be reduced and a variation of the film thickness can be small. The thickness of the oxide semiconductor layer is greater than or equal to 2 nm and less than or equal to 200 nm, preferably greater than or equal to 5 nm and less than or equal to 30 nm. Note that an appropriate thickness depends on an applied oxide semiconductor material, and the thickness of the oxide semiconductor layer may be set as appropriate depending on the material.

Note that before the oxide semiconductor layer is formed by a sputtering method, dust attached to a surface of the gate insulating layer 138 is preferably removed by reverse sputtering in which an argon gas is introduced and plasma is generated. Here, the reverse sputtering means a method for improving the quality of a surface of the object to be processed by ions striking on the surface, while general sputtering is achieved by ions striking on a sputtering target. Methods for making ions strike the surface of the object to be processed include a method in which a high frequency voltage is applied on the surface in an argon atmosphere and plasma is generated in the vicinity of the substrate. Note that a nitrogen atmosphere, a helium atmosphere, an oxygen atmosphere, or the like may be used instead of the argon atmosphere.

For the etching of the oxide semiconductor layer, either dry etching or wet etching may be used. Needless to say, a combination of dry etching and wet etching may be employed. The etching conditions (an etching gas, etching solution, etching time, temperature, or the like) are set as appropriate, depending on the material, so that the oxide semiconductor layer can be etched into a desired shape.

Examples of the etching gas for dry etching are a gas containing chlorine (a chlorine-based gas such as chlorine ($Cl_2$), triboron chloride ($BCl_3$), tetrasilicon chloride ($SiCl_4$), or carbon tetrachloride ($CCl_4$)) and the like. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like may be used.

As a dry etching method, a parallel plate reactive ion etching (RIE) method or an inductively coupled plasma (ICP) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are set as appropriate.

As an etchant used for wet etching, a mixed solution of phosphoric acid, acetic acid, and nitric acid, an ammonia peroxide mixture (hydrogen peroxide water at 31 wt %: ammonia water at 28 wt %: water=5:2:2), or the like can be used. Alternatively, an etchant such as ITO07N (manufactured by Kanto Chemical Co., Inc.) may be used.

Then, the oxide semiconductor layer is preferably subjected to first heat treatment. By this first heat treatment, the oxide semiconductor layer can be dehydrated or dehydrogenated. The first heat treatment is performed at a temperature higher than or equal to 300° C. and lower than or equal to 750° C., preferably, higher than or equal to 400° C. and lower than the strain point of the substrate. For example, the substrate is introduced into an electric furnace in which a resistance heating element or the like is used and the oxide semiconductor layer 140 is subjected to heat treatment in a nitrogen atmosphere at a temperature of 450° C. for one hour. At this time, the oxide semiconductor layer 140 is not exposed to the air so that entry of water or hydrogen is prevented.

Note that a heat treatment apparatus is not limited to an electrical furnace, and may include a device for heating an object to be processed by heat conduction or heat radiation given by a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed as follows. The substrate is placed in an inert gas which has been heated to a high temperature of 650° C. to 700° C., heated for several minutes, and taken out from the inert gas. GRTA enables high-temperature heat treatment for a short time. In addition, such heat treatment is applicable even when a temperature exceeds the strain point of the substrate because it takes only short time.

Note that the first heat treatment is preferably performed in an atmosphere which contains nitrogen or a rare gas (e.g., helium, neon, or argon) as its main component and does not contain water, hydrogen, or the like. For example, the purity of nitrogen or a rare gas such as helium, neon, or argon introduced into the heat treatment apparatus is greater than or equal to 6 N (99.9999%), preferably greater than or equal to 7 N (99.99999%) (that is, the concentration of impurities is less than or equal to 1 ppm, preferably less than or equal to 0.1 ppm).

In some cases, the oxide semiconductor layer might be crystallized to be a microcrystalline layer or a polycrystalline layer depending on the condition of the first heat treatment or the material of the oxide semiconductor layer. For example, the oxide semiconductor layer may be crystallized to become a microcrystalline oxide semiconductor layer having a degree of crystallization of greater than or equal to 90%, or greater than or equal to 80%. Further, depending on the condition of the first heat treatment or the material of the oxide semiconductor layer, the oxide semiconductor layer may become an amorphous oxide semiconductor layer containing no crystalline component.

The oxide semiconductor layer might become an oxide semiconductor layer in which a crystal (with a grain diameter greater than or equal to 1 nm and less than or equal to 20 nm, typically greater than or equal to 2 nm and less than or equal to 4 nm) is mixed in an amorphous oxide semiconductor (e.g. a surface of the oxide semiconductor layer).

In addition, electric characteristics of the oxide semiconductor layer can be changed by providing a crystal layer over the amorphous surface of the oxide semiconductor layer. For example, in the case of forming the oxide semiconductor layer with the use of an In—Ga—Zn—O-based oxide semiconductor target for film formation, the electric characteristics of the oxide semiconductor layer can be changed by forming a crystal portion in which a crystal grain represented by $In_2Ga_2ZnO_7$ which has electrical anisotropy is aligned.

More specifically, for example, by aligning the crystal grain in such a manner that c-axis of $In_2Ga_2ZnO_7$ is oriented in a direction perpendicular to a surface of the oxide semiconductor layer, conductivity in a direction parallel to the surface of the oxide semiconductor layer is improved, whereby an insulating property in the direction perpendicular to the surface of the oxide semiconductor layer can be increased. Further, such a crystal portion has a function of suppressing entry of an impurity such as water or hydrogen to the oxide semiconductor layer.

Note that the above oxide semiconductor layer which includes the crystal portion can be formed by heating a surface of the oxide semiconductor layer by GRTA. When a sputtering target in which the amount of Zn is smaller than that of In or Ga is used, more favorable formation can be achieved.

The first heat treatment performed on the oxide semiconductor layer 140 can be performed on the oxide semiconductor layer which has not yet been processed into the island-shaped layer. In that case, after the first heat treatment, the substrate is taken out of the heating apparatus and a photolithography step is performed.

Note that the above heat treatment can dehydrate or dehydrogenate the oxide semiconductor layer 140 and thus can be called dehydration treatment or dehydrogenation treatment. It is possible to perform such dehydration treatment or dehydrogenation treatment at any timing, for example, after the oxide semiconductor layer is formed, after the source and drain electrodes are stacked over the oxide semiconductor layer 140, or after a protective insulating layer is formed over the source and drain electrodes. Such dehydration treatment or dehydrogenation treatment may be performed more than once.

Next, the source or drain electrode 142a and the source or drain electrode 142b are formed in contact with the oxide semiconductor layer 140 (see FIG. 4F). The source or drain electrode 142a and the source or drain electrode 142b can be formed in such a manner that a conductive layer is formed so as to cover the oxide semiconductor layer 140 and then selectively etched.

The conductive layer can be formed by a PVD method such as a sputtering method, a CVD method such as a plasma CVD method. As a material of the conductive layer, an element selected from aluminum, chromium, copper, tantalum, titanium, molybdenum, and tungsten, an alloy containing any of the above elements as its component, or the like can be used. Further, one or more materials selected from manganese, magnesium, zirconium, beryllium, and thorium may be used. A material in which aluminum and one or more elements selected from titanium, tantalum, tungsten, molybdenum, chromium, neodymium, and scandium are combined is also applicable to the material of the conductive layer. The conductive layer may have either a single-layer structure or a stacked-layer structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given.

Alternatively, the conductive layer may be formed using conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO), or any of these metal oxide materials in which silicon or silicon oxide is contained can be used.

Here, ultraviolet rays, a KrF laser beam, or an ArF laser beam is preferably used for exposure for forming an etching mask.

The channel length (L) of the transistor is determined by a distance between the source or drain electrode 142a and the source or drain electrode 142b. In the case where the channel length (L) is less than 25 nm, exposure for making a mask is performed in the extreme ultraviolet range of several nanometers to several tens of nanometers which is extremely short wavelength. In the exposure using extreme ultraviolet light, the resolution is high and the focus depth is large. Therefore, the channel length (L) of the transistor to be formed later can be greater than or equal to 10 nm and less than or equal to 1000 nm, whereby operation speed of a circuit can be increased. Further, off-state current of the transistor is extremely small, which prevents increase in power consumption.

Materials of the layers and etching conditions are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source or drain electrode 142a, and between the oxide semiconductor layer 140 and the source or drain electrode 142b. An oxide conductive layer and the metal layer for forming the source or drain electrode 142a and the source or drain electrode 142b can be successively formed (successive deposition). The oxide conductive layer can function as a source region or a drain region. By providing such an oxide conductive layer, resistance of the source and drain regions can be reduced and high-speed operation of the transistor can be realized.

In order to reduce the number of the masks and steps, etching may be performed with the use of a resist mask formed using a multi-tone mask which is a light-exposure mask through which light is transmitted so as to have a plurality of intensities. A resist mask formed with the use of a multi-tone mask has a shape with a plurality of thicknesses (a step-like shape) and further can be changed in shape by ashing; therefore, the resist mask can be used in a plurality of etching steps for processing into different patterns. That is, a resist mask corresponding to at least two or more kinds of different patterns can be formed by one multi-tone mask. Thus, the number of light-exposure masks can be reduced and the number of corresponding photolithography steps can be also reduced, whereby simplification of a process can be realized.

Note that plasma treatment using a gas such as $N_2O$, $N_2$, or Ar is preferably performed after the above step. By this plasma treatment, water attached to a surface of the oxide semiconductor layer which is exposed is removed. Alternatively, plasma treatment may be performed using a gas containing oxygen such as a mixed gas of oxygen and argon. In this manner, the oxide semiconductor layer is supplied with oxygen and defects resulted from oxygen deficiency can be reduced.

After that, the protective insulating layer 144 which is in contact with part of the oxide semiconductor layer 140 is formed without exposure to the air (see FIG. 4G).

The protective insulating layer 144 can be formed by appropriately employing a method such as a sputtering method, by which an impurity such as water or hydrogen is prevented from entering the protective insulating layer 144. The protective insulating layer 144 has a thickness of at least 1 nm. As a material which can be used for the protective insulating layer 144, there are silicon oxide, silicon nitride, silicon oxynitride, silicon nitride oxide, and the like. The protective insulating layer 144 may have a single-layer structure or a stacked-layer structure. The substrate temperature for formation of the protective insulating layer 144 is preferably higher than or equal to room temperature and lower than or equal to 300° C. The atmosphere for formation of the protective insulating layer 144 is preferably a rare gas (typically argon) atmosphere, an oxygen atmosphere, or a mixed atmosphere of a rare gas (typically argon) and oxygen.

When hydrogen is contained in the protective insulating layer 144, entry of the hydrogen to the oxide semiconductor layer, extraction of oxygen in the oxide semiconductor layer by the hydrogen, or the like is caused, and the resistance of the backchannel side of the oxide semiconductor layer is made low, which may form a parasitic channel. Therefore, it is important not to use hydrogen in forming the protective insulating layer 144 so that the oxide insulating layer 144 contains hydrogen as little as possible.

In addition, it is preferable that the protective insulating layer 144 be formed while remaining moisture in the treatment chamber is removed. This is for preventing hydrogen, water, a hydroxyl group, or hydride from being contained in the oxide semiconductor layer 140 and the protective insulating layer 144.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. A hydrogen atom, a compound containing a hydrogen atom, such as water ($H_2O$), or the like is removed from the deposition chamber which is evacuated with the cryopump, whereby the concentration of impurities contained in the protective insulating layer 144 formed in the deposition chamber can be reduced.

As a sputtering gas used in formation of the protective insulating layer 144, a high-purity gas from which an impurity such as hydrogen, water, a hydroxyl group, or hydride is reduced to approximately several parts per million (preferably several parts per billion) is preferably used.

Then, second heat treatment (preferably at a temperature higher than or equal to 200° C. and lower than or equal to 400° C., for example, higher than or equal to 250° C. and lower than or equal to 350° C.) in an inert gas atmosphere or an oxygen atmosphere is preferably performed. For example, the second heat treatment is performed in a nitrogen atmosphere at 250° C. for one hour. The second heat treatment can reduce variation in the electric characteristics of the transistor. Further, the oxide semiconductor layer can be supplied with oxygen by the second heat treatment.

Further, heat treatment may be performed at a temperature higher than or equal to 100° C. and lower than or equal to 200° C. for greater than or equal to one hour and less than or equal to 30 hours in the air. This heat treatment may be performed at a fixed heating temperature. Alternatively, the following temperature cycle may be applied plural times repeatedly: the temperature is increased from room temperature to a temperature higher than or equal to 100° C. and lower than or equal to 200° C. and then decreased to room temperature. Further, this heat treatment may be performed under a reduced pressure before formation of the protective insulating layer. The reduced pressure enables the heat treatment time to be short. Note that this heat treatment may be performed instead of the second heat treatment; alternatively, this heat treatment may be performed in addition to the second heat treatment before and/or after the second heat treatment.

Then, the interlayer insulating layer 146 is formed over the protective insulating layer 144 (see FIG. 5A). The interlayer insulating layer 146 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the interlayer insulating layer 146. Further, a surface of the interlayer insulating layer 146 is preferably subjected to CMP, etching, or the like so as to be flattened after the interlayer insulating layer 146 is formed.

Next, openings reaching the electrodes 136a, 136b, and 136c, the source or drain electrode 142a, and the source or drain electrode 142b are formed in the interlayer insulating layer 146, the protective insulating layer 144, and the gate insulating layer 138; then, a conductive layer 148 is formed so as to be embedded in the openings (see FIG. 5B). The above openings can be formed by etching with the use of a mask, for example. The mask can be formed by exposure using a photomask, for example. For the etching, either wet etching or dry etching may be performed but dry etching is preferable in view of the fine patterning. The conductive layer 148 can be formed by a deposition method such as a PVD method or a CVD method. Examples of a material for the conductive layer 148 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 148 can be formed as follows: a titanium film is formed to have a small thickness by a PVD method in a region including the openings and a titanium nitride film is then formed to have a small thickness by a CVD method; and then, a tungsten film is formed so as to be embedded in the openings. Here, the titanium film formed by a PVD method has a function of reducing an oxide film at an interface with a lower electrode (here, the electrodes 136a, 136b, and 136c, the source or drain electrode 142a, the source or drain electrode 142b, or the like), so that contact resistance with the lower electrode is reduced. In addition, the subsequently formed titanium nitride film has a barrier property such that diffusion of a conductive material is prevented. Further, after a barrier film is formed using titanium, titanium nitride, or the like, a copper film may be formed by a plating method.

After the conductive layer 148 is formed, part of the conductive layer 148 is removed by etching, CMP, or the like so that the interlayer insulating layer 146 is exposed and the electrodes 150a, 150b, 150c, 150d and 150e are formed (see FIG. 5C). Note that when the electrodes 150a, 150b, 150c, 150d and 150e are formed by removing part of the above conductive layer 148, processing is preferably performed so that flattened surfaces are obtained. By flattening surfaces of the interlayer insulating layer 146 and the electrodes 150a, 150b, 150c, 150d and 150e, favorable electrodes, wirings, insulating layers, semiconductor layers, or the like can be formed in a later step.

Further, the insulating layer 152 is formed and openings reaching the electrodes 150a, 150b, 150c, 150d and 150e are formed in the insulating layer 152; then, a conductive layer is formed so as to be embedded in the openings. After that, part of the conductive layer is removed by etching, CMP, or the like so that the insulating layer 152 is exposed and the electrodes 154a, 154b, 154c, and 154d are formed (see FIG. 5D). This step is similar to that of forming the electrode 150a and the like; therefore, detailed description is omitted here.

When the transistor 162 is manufactured in the above-described manner, the hydrogen concentration of the oxide semiconductor layer 140 is less than or equal to $5 \times 10^{19}$ atoms/cm$^3$ and off-state current of the transistor 162 is less than or equal to $1 \times 10^{-13}$ A. Thus, the transistor 162 having excellent characteristics can be obtained by employing the highly purified oxide semiconductor layer 140 in which the hydrogen concentration is sufficiently reduced and defects resulted from oxygen deficiency are reduced. In addition, a semiconductor device having excellent characteristics which includes the transistor 160 which uses a material other than an oxide semiconductor in a lower portion and the transistor 162 which uses an oxide semiconductor in an upper portion can be manufactured.

Note that although many researches on a physical property of an oxide semiconductor are conducted, they do not suggest an idea of sufficiently reducing localized states. In one embodiment of the disclosed invention, water or hydrogen which can induce localized states is removed from an oxide semiconductor, whereby a highly purified oxide semiconductor is manufactured. This is based on an idea of sufficiently reducing localized states. Thus, excellent industrial products can be manufactured.

Note that when hydrogen, water, or the like is removed, oxygen is also removed in some cases. Therefore, it is favorable that the oxide semiconductor be further purified (made to be an i-type oxide semiconductor) by supplying oxygen to dangling bonds of metal which are generated by oxygen deficiency so that localized states resulted from oxygen deficiency are reduced. For example, localized states resulted from oxygen deficiency can be reduced in the following manner: an oxide film having excessive oxygen is formed in a close contact with a channel formation region; and heat treatment at 200° C. to 400° C., typically, approximately 250° C., is performed so that oxygen is supplied from the oxide film. An inert gas may be switched to a gas containing oxygen during the second heat treatment. Further, after the second heat treatment, oxygen can be supplied to the oxide semiconductor through a temperature decreasing process in an oxygen atmosphere or an atmosphere in which hydrogen or water is sufficiently reduced.

It can be considered that a factor of deterioration of characteristics of an oxide semiconductor is a shallow level due to excessive hydrogen at 0.1 eV to 0.2 eV below the conduction band, a deep level resulted from oxygen deficiency, or the like. A technical idea of thoroughly removing hydrogen and sufficiently supplying oxygen in order to correct these defects ought to be valid.

In the disclosed invention, since an oxide semiconductor is highly purified, carrier concentration of the oxide semiconductor is sufficiently low.

With the use of Fermi-Dirac distribution function, intrinsic carrier density of an oxide semiconductor having an energy gap at 3.05 eV to 3.15 eV is $10^{-7}$/cm$^3$, which is much lower than intrinsic carrier density of $1.45 \times 10^{10}$/cm$^3$ of silicon.

Accordingly, the number of holes that are minority carriers is extremely small. Leakage current of an insulated gate field effect transistor (IGFET) in a reverse bias is expected to be less than or equal to 100 aA/μm, preferably, less than or equal to 10 aA/μm, or more preferably less than or equal to 1 aA/μm. Note that "1 aA/μm" means that flowing current per micrometer of channel width of a transistor is 1 aA ($1 \times 10^{-18}$ A).

In fact, SiC (3.26 eV), GaN (3.42 eV), and the like are known as a semiconductor having a wide gap which has an energy gap greater than or equal to 3 eV. Transistor characteristics similar to the above described characteristics are expected to be obtained with the use of these semiconductors. However, it is substantially impossible to form a thin film of these semiconductor materials because they need process temperature higher than or equal to 1500° C. In addition, the process temperature is so high that these materials cannot be stacked in three dimensions over a silicon integrated circuit. On the other hand, an oxide semiconductor can be deposited as a thin film by sputtering at room temperature to 400° C. and can be dehydrated or dehydrogenated (removal of hydrogen or water) and supplied with oxygen (supply of oxygen to an oxide semiconductor layer) at 450° C. to 700° C.; thus, an oxide semiconductor can be stacked in three dimensions over a silicon integrated circuit.

Note that although an oxide semiconductor generally has an n-type conductivity, in one embodiment of the disclosed invention, an oxide semiconductor is made to be an i-type oxide semiconductor by removing an impurity such as water or hydrogen and supplying oxygen that is a component of an oxide semiconductor. From this aspect, different from the case of silicon which is made to be an i-type silicon by adding an impurity, one embodiment of the disclosed invention includes a novel technical idea.

<Electrical Conduction Mechanism of Transistor Using Oxide Semiconductor>

An electrical conduction mechanism of a transistor including an oxide semiconductor will be described with reference to FIG. 6, FIG. 7, FIGS. 8A and 8B, and FIG. 9. Note that the following description is based on the assumption of an ideal situation for easy understanding and does not necessarily reflect a real situation. Note also that the following description is just a consideration and does not affect the validity of the invention.

Figure 6:
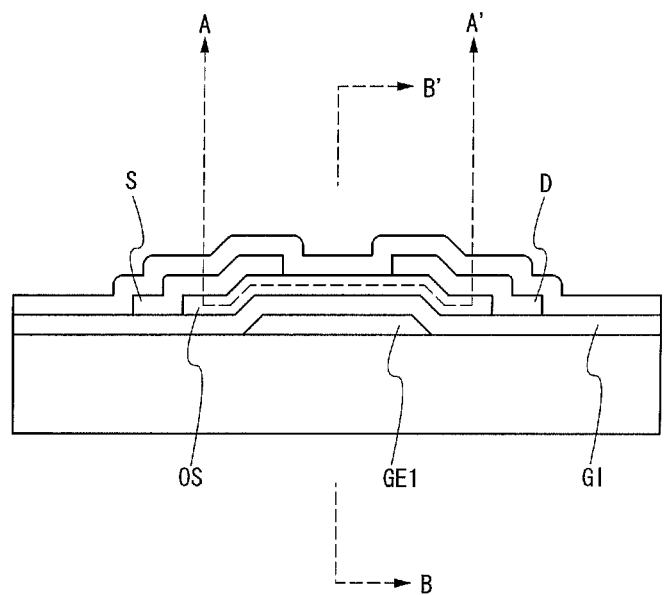
FIG. 6 is a cross-sectional view of a transistor including an oxide semiconductor.

FIG. 6 is a cross-sectional view of a transistor (thin film transistor) including an oxide semiconductor. An oxide semiconductor layer (OS) is provided over a gate electrode (GE1) with a gate insulating layer (GI) interposed therebetween, and a source electrode (S) and a drain electrode (D) are provided thereover. An insulating layer is provided so as to cover the source electrode (S) and the drain electrode (D).

Figure 7:
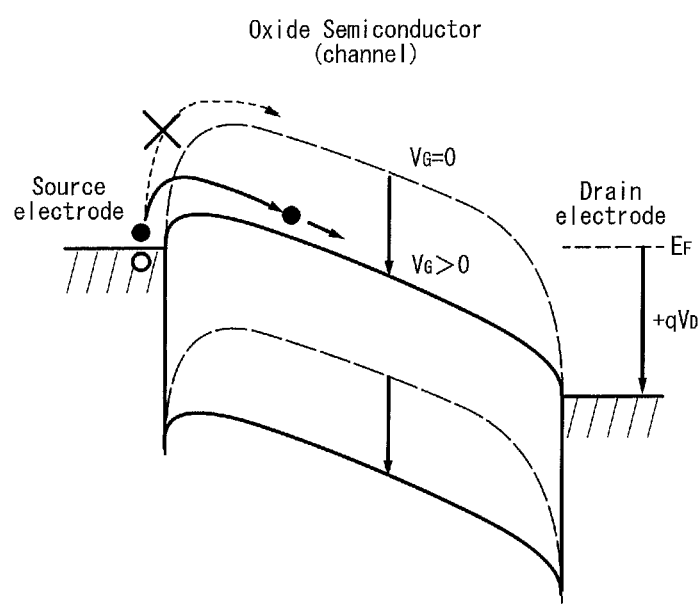
FIG. 7 is an energy band diagram (schematic diagram) along an A-A' section in FIG. 6.

FIG. 7 is an energy band diagram (schematic diagram) of the A-A' section in FIG. 6. In FIG. 7, a black circle (●) and a white circle (○) represent an electron and a hole and have electric charges (−q, +q), respectively. With a positive voltage ($V_D>0$) applied to the drain electrode, the dashed line shows the case where no voltage is applied to the gate electrode ($V_G=0$) and the solid line shows the case where a positive voltage is applied to the gate electrode ($V_G>0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 8A:
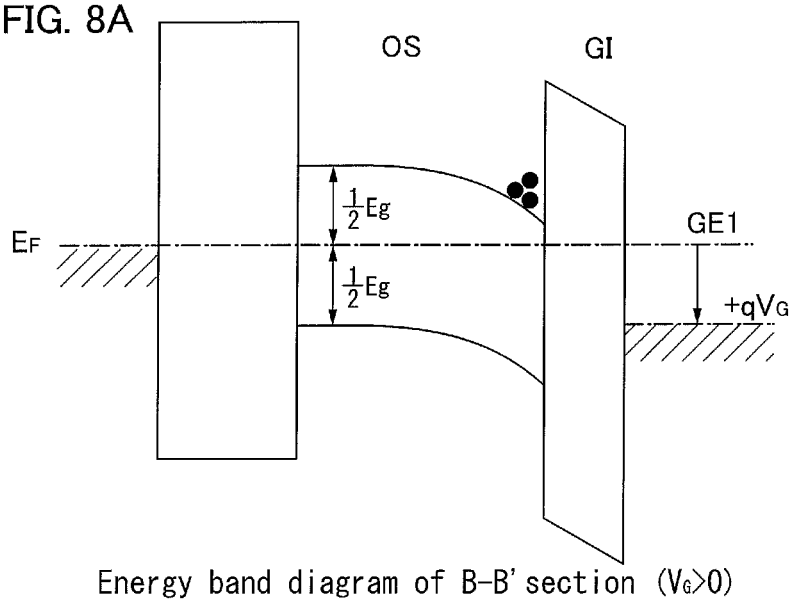
FIG. 8A is a diagram illustrating a state where a positive voltage ($V_G>0$) is applied to a gate (GE1) and FIG. 8B is a diagram illustrating a state where a negative voltage ($V_G<0$) is applied to the gate (GE1)
Figure 8B:
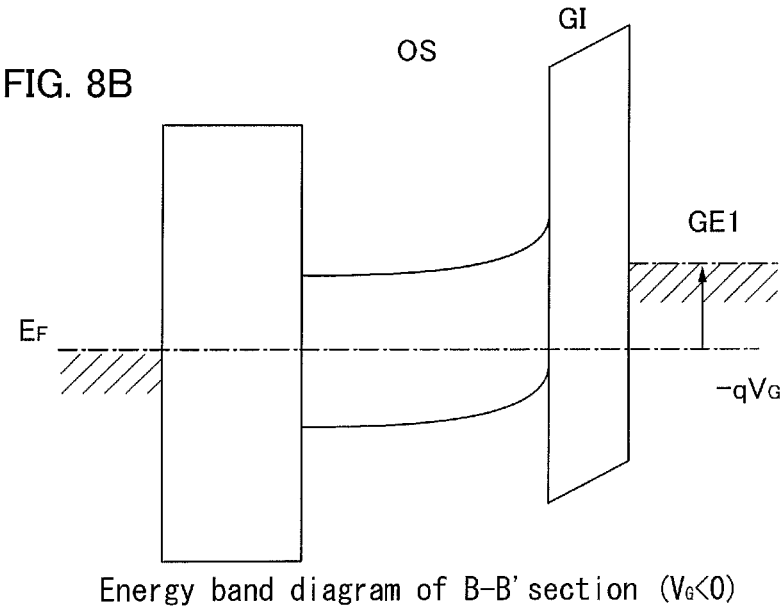

FIGS. 8A and 8B are energy band diagrams (schematic diagrams) of the B-B' section in FIG. 6. FIG. 8A illustrates an on state in which a positive voltage ($V_G>0$) is applied to the gate electrode (GE1) and carriers (electrons) flow between the source electrode and the drain electrode. FIG. 8B illustrates an off state in which a negative voltage ($V_G<0$) is applied to the gate electrode (GE1) and minority carriers do not flow.

Figure 9:
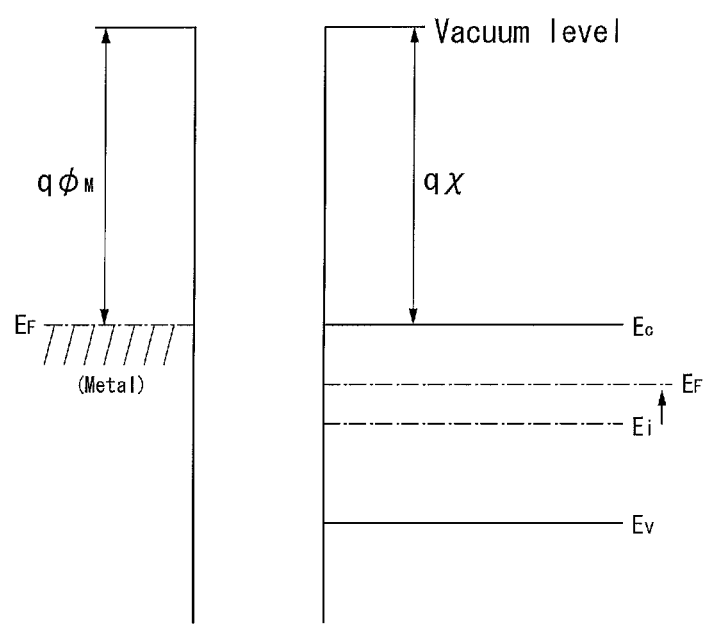
FIG. 9 is a diagram illustrating the relationships between the vacuum level and the work function of a metal ($\phi_M$) and between the vacuum level and the electron affinity ($\chi$) of an oxide semiconductor.

FIG. 9 illustrates the relationships between the vacuum level and the work function of a metal ($\phi_M$) and between the vacuum level and the electron affinity ($\chi$) of an oxide semiconductor.

At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to one embodiment of the disclosed invention is an intrinsic (i-type) or a substantially intrinsic oxide semiconductor which is obtained by removing hydrogen that is a factor for an n-type semiconductor from an oxide semiconductor and purifying the oxide semiconductor such that an element other than a main component of the oxide semiconductor (i.e., an impurity element) is prevented from being contained therein as much as possible. In other words, a feature is that a purified i-type (intrinsic) semiconductor, or a semiconductor close thereto, is obtained not by adding an impurity element but by removing an impurity such as hydrogen or water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

At that time, the electron moves in the vicinity of the interface between the gate insulating layer and the purified oxide semiconductor (the lowest portion of the oxide semiconductor which is stable in terms of energy) as illustrated in FIG. 8A.

In addition, as illustrated in FIG. 8B, when a negative potential is applied to the gate electrode (GE1), the value of current is extremely close to zero because holes that are minority carriers are substantially zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is purified and the interface between the oxide semiconductor and the gate insulating layer is made favorable, in the case where the transistor has a channel width (W) of $1\times10^4$ μm and a channel length (L) of 3 μm, for example, it is possible to realize an off-state current of $10^{-13}$ A or less and a subthreshold swing (S value) of 0.1 V/dec (with a 100-nm-thick gate insulating layer).

The oxide semiconductor is purified as described above so as to contain an element other than its main element (i.e., an impurity element) as little as possible, so that the transistor can operate in a favorable manner.

<Carrier Concentration>

In a technical idea according to the disclosed invention, an oxide semiconductor layer is made as close as possible to an intrinsic (i-type) oxide semiconductor layer by sufficiently reducing carrier concentration thereof. Hereinafter, a method for calculating the carrier concentration and carrier concentration actually measured are described with reference to FIG. 10 and FIG. 11.

First, a method for calculating the carrier concentration is easily explained. The carrier concentration can be calculated in such a manner that a MOS capacitor is manufactured and results of C-V measurement (C-V characteristics) of the MOS capacitor are evaluated.

Specifically, carrier concentration $N_d$ is calculated in the following manner: C-V characteristics are obtained by plotting relations between a gate voltage $V_G$ and a capacitance C of a MOS capacitor; a graph of a relation between the gate voltage $V_G$ and $(1/C)^2$ is obtained with the use of the C-V characteristics; a differential value of $(1/C)^2$ in a weak inversion region of the graph is found; and the differential value is substituted into Formula 1. Note that e, $\epsilon_0$, and $\epsilon$ in Formula 1 represent elementary electric charge, vacuum permittivity, and relative dielectric constant of an oxide semiconductor, respectively.

$$N_d = -\left(\frac{2}{e\epsilon_0\epsilon}\right) \Big/ \frac{d(1/C)^2}{dV} \quad (1)$$

Next, carrier concentration actually measured by the above method is described. For the measurement, a sample (a MOS capacitor) which was formed as follows was used: a titanium film was formed to a thickness of 300 nm over a glass substrate; a titanium nitride film was formed to a thickness of 100 nm over the titanium film; an oxide semiconductor layer using an In—Ga—Zn—O-based oxide semiconductor was formed to a thickness of 2 μm over the titanium nitride film; and a silver film was formed to a thickness of 300 nm over the oxide semiconductor layer. Note that the oxide semiconductor layer was formed using a target for depositing an oxide semiconductor including In, Ga, and Zn (In:Ga:Zn=1:1:0.5 [atomic ratio]) by a sputtering method. Further, a formation atmosphere of the oxide semiconductor layer was a mixed atmosphere of argon and oxygen (a flow ratio was $Ar:O_2=30$ (sccm):15 (sccm)).

Figure 10:
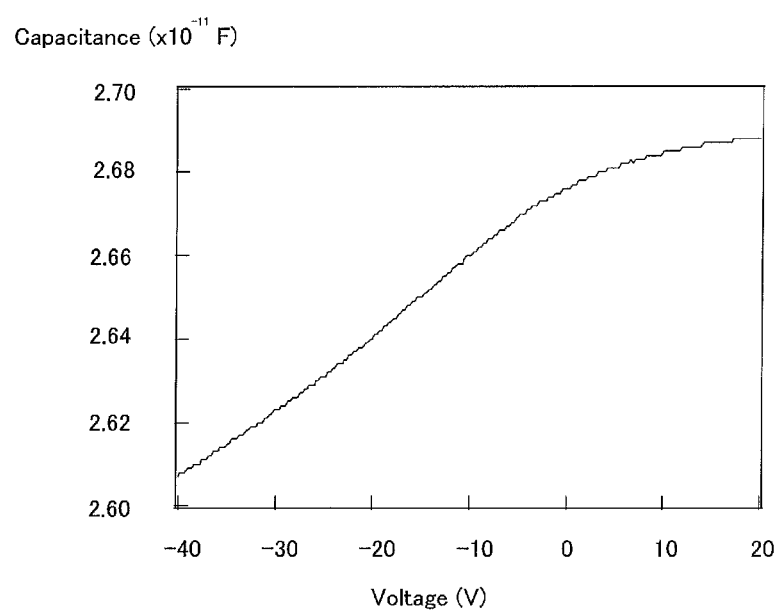
FIG. 10 illustrates C-V characteristics.
Figure 11:
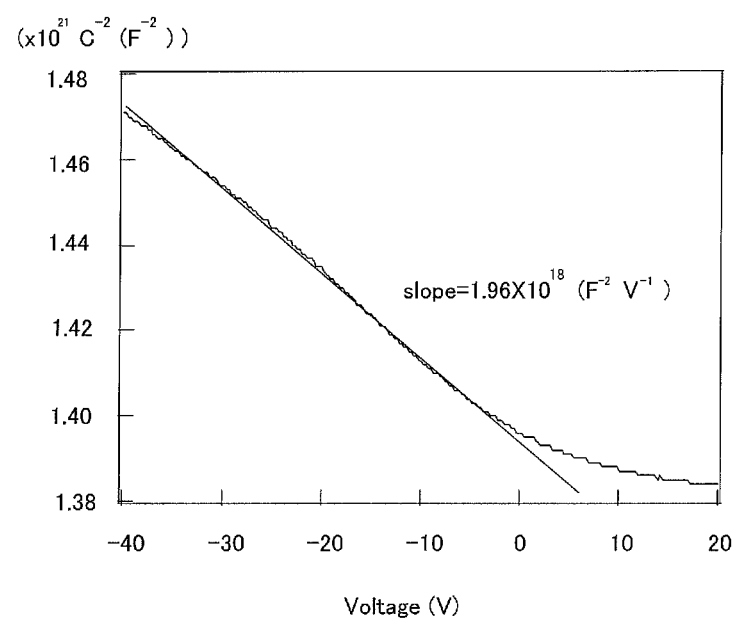
FIG. 11 illustrates a relation between $V_g$ and $(1/C)^2$.

The C-V characteristics and the relation between $V_g$ and $(1/C)^2$ are illustrated in FIG. 10 and FIG. 11, respectively. The carrier concentration calculated using Formula 1 from the differential value of $(1/C)^2$ in a weak inversion region of the graph of FIG. 11 was $6.0\times10^{10}/cm^3$.

As described above, by using an oxide semiconductor which is made to be an i-type or substantially i-type oxide semiconductor (for example, carrier concentration is less than $1\times10^{12}/cm^3$, preferably, less than or equal to $1\times10^{11}/cm^3$), a transistor which has extremely favorable off-state current characteristics can be obtained.

Modification Example

Modification examples of a structure of a semiconductor device are described with reference to FIG. 12, FIGS. 13A and 13B, FIGS. 14A and 14B, and FIGS. 15A and 15B. Note that in the following modification examples, the structure of the transistor 162 is different from that already described. In other words, the structure of the transistor 160 is similar to that already described.

Figure 12:
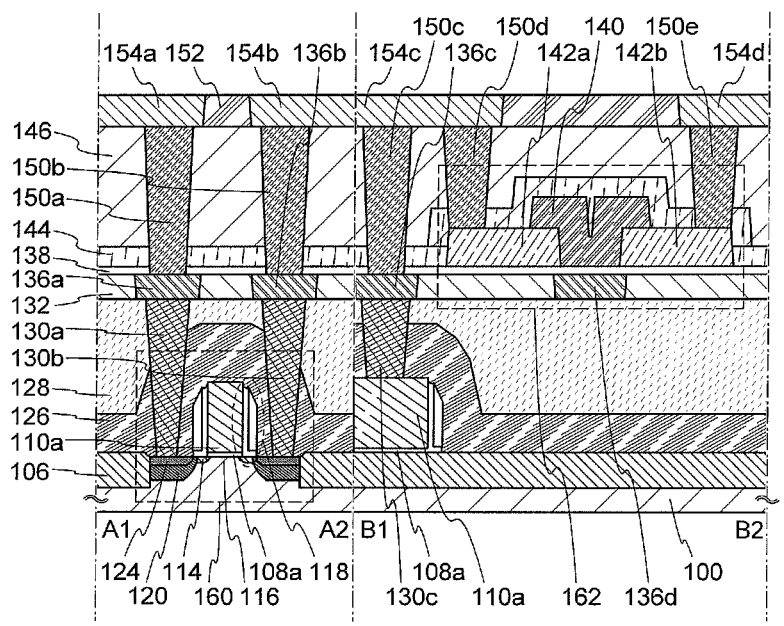
FIG. 12 is a cross-sectional view for illustrating a semiconductor device.

In an example illustrated in FIG. 12, the transistor 162 includes the gate electrode 136d under the oxide semiconductor layer 140 and the source or drain electrode 142a and the source or drain electrode 142b which are in contact with the oxide semiconductor layer 140 at part of a bottom surface of the oxide semiconductor layer 140. Since a plan structure may be appropriately changed corresponding to a cross-sectional structure, only the cross-sectional structure is described here.

As a large difference between the structure illustrated in FIG. 12 and that illustrated in FIGS. 2A and 2B, there are connection positions where the source or drain electrode 142a and the source or drain electrode 142b are connected to the oxide semiconductor layer 140. That is, in the structure illustrated in FIGS. 2A and 2B, the source or drain electrode 142a and the source or drain electrode 142b are in contact with the oxide semiconductor layer 140 at part of a top surface of the oxide semiconductor layer 140; on the other hand, in the structure illustrated in FIG. 12, the source or drain electrode 142a and the source or drain electrode 142b are in contact with the oxide semiconductor layer 140 at the part of the bottom surface of the oxide semiconductor layer 140. In addition, resulting from this difference in contact, a position of another electrode, another insulating layer, or the like is changed. The details of each component are the same as those of FIGS. 2A and 2B, and the like.

Specifically, the transistor 162 includes: the gate electrode 136d provided over the interlayer insulating layer 128; the gate insulating layer 138 provided over the gate electrode 136d; the source or drain electrode 142a and the source or drain electrode 142b which are provided over the gate insulating layer 138; and the oxide semiconductor layer 140 in contact with parts of top surfaces of the source or drain electrode 142a and the source or drain electrode 142b.

Here, the gate electrode 136d is provided so as to be embedded in the insulating layer 132 which is formed over the interlayer insulating layer 128. Furthermore, similarly to the gate electrode 136d, an electrode 136a, an electrode 136b, and an electrode 136c are formed in contact with the source or drain electrode 130a, the source or drain electrode 130b, and the electrode 130c, respectively.

Over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142a and the source or drain electrode 142b are formed. In the openings, the electrode 150d and the electrode 150e are formed to be in contact with the source or drain electrode 142a and the source or drain electrode 142b, respectively. Similarly to the electrodes 150d and 150e, the electrode 150a, the electrode 150b, and the electrode 150c are formed to be in contact with the electrode 136a, the electrode 136b, and the electrode 136c, respectively, in openings provided in the gate insulating layer 138, the protective insulating layer 144, and the interlayer insulating layer 146.

Here, the oxide semiconductor layer 140 is preferably an oxide semiconductor layer which is highly purified by removing an impurity such as hydrogen. Specifically, hydrogen concentration in the oxide semiconductor layer 140 is less than or equal to $5\times10^{19}$ atoms/cm³, preferably, less than or equal to $5\times10^{18}$ atoms/cm³, or more preferably, less than or equal to $5\times10^{17}$ atoms/cm³. Further, the oxide semiconductor layer 140 is preferably an oxide semiconductor layer in which defects resulted from oxygen deficiency are reduced by containing sufficient oxygen. In the oxide semiconductor layer 140 which is highly purified by sufficiently reducing the hydrogen concentration and in which defects resulted from oxygen deficiency are reduced, the carrier concentration is less than $1\times10^{12}/cm^3$, preferably, less than or equal to $1\times10^{11}/cm^3$. The transistor 162 with excellent off-state current characteristics can be obtained with the use of such an i-type or substantially i-type oxide semiconductor. For example, when the drain voltage $V_d$ is +1 V or +10 V and the gate voltage $V_g$ is in the range of −5 V to −20V, the off-state current is $1\times10^{-13}$ A or less. When the highly purified oxide semiconductor layer 140 in which the hydrogen concentration is sufficiently reduced and defects resulted from oxygen deficiency are reduced is employed and off-state current of the transistor 162 is reduced, a semiconductor device having a novel structure can be realized. Note that the hydrogen concentration in the oxide semiconductor layer 140 was measured by secondary ion mass spectroscopy (SIMS).

Furthermore, the insulating layer 152 is provided over the interlayer insulating layer 146. The electrode 154a, the electrode 154b, the electrode 154c, and the electrode 154d are provided so as to be embedded in the insulating layer 152. Here, the electrode 154a is in contact with the electrode 150a; the electrode 154b, the electrode 150b; the electrode 154c, the electrodes 150c and 150d; and the electrode 154d, the electrode 150e.

Figure 13A:
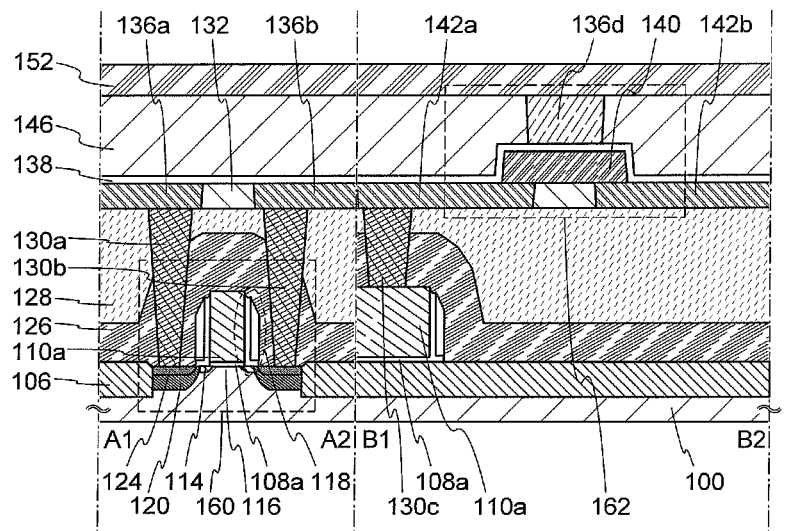
FIGS. 13A and 13B are each a cross-sectional view for illustrating a semiconductor device.
Figure 13B:
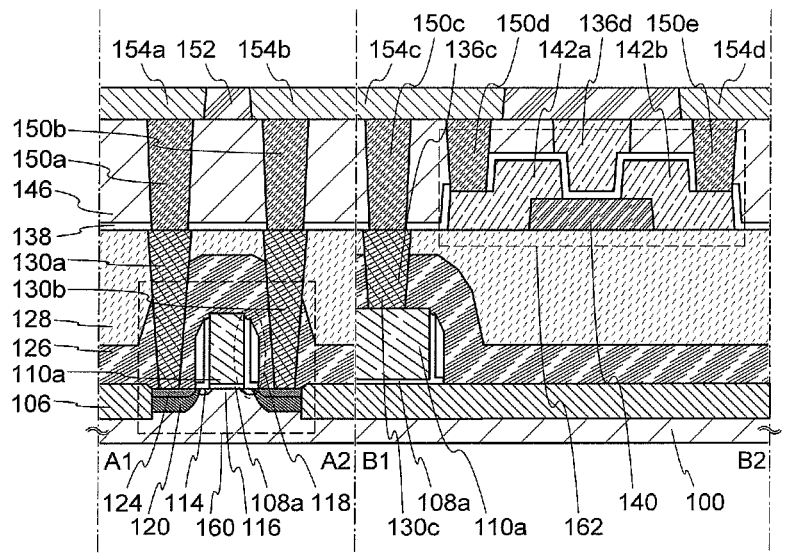

FIGS. 13A and 13B each illustrate an example in which the gate electrode 136d is provided over the oxide semiconductor layer 140. Here, FIG. 13A illustrates an example in which the source or drain electrode 142a and the source or drain electrode 142b are in contact with the oxide semiconductor layer 140 at the part of the bottom surface of the oxide semiconductor layer 140; and FIG. 13B illustrates an example in which the source or drain electrode 142a and the source or drain electrode 142b are in contact with the oxide semiconductor layer 140 at the part of the top surface of the oxide semiconductor layer 140.

The structures of FIGS. 13A and 13B are largely different from those of FIGS. 2A and 2B and FIG. 12 in that the gate electrode 136*d* is provided over the oxide semiconductor layer 140. In addition, a large difference between the structure illustrated in FIG. 13A and that illustrated in FIG. 13B is that which of the part of the bottom surface or the part of the top surface of the oxide semiconductor layer 140 the source and drain electrodes 142*a* and 142*b* are in contact with. In addition, resulting from these differences, a position of another electrode, another insulating layer, or the like is changed. The details of each component are the same as those of FIGS. 2A and 2B, and the like.

Specifically, in FIG. 13A, the transistor 162 includes: the source or drain electrode 142*a* and the source or drain electrode 142*b* which are provided over the interlayer insulating layer 128; the oxide semiconductor layer 140 which is in contact with the parts of the top surfaces of the source or drain electrode 142*a* and the source or drain electrode 142*b*; the gate insulating layer 138 provided over the oxide semiconductor layer 140; and the gate electrode 136*d* over the gate insulating layer 138 which is provided in a region overlapping with the oxide semiconductor layer 140.

In FIG. 13B, the transistor 162 includes: the oxide semiconductor layer 140 provided over the interlayer insulating layer 128; the source or drain electrode 142*a* and the source or drain electrode 142*b* which are provided in contact with the part of the top surface of the oxide semiconductor layer 140; the gate insulating layer 138 provided over the oxide semiconductor layer 140, the source or drain electrode 142*a*, and the source or drain electrode 142*b*; and the gate electrode 136*d* over the gate insulating layer 138 which is provided in a region overlapping with the oxide semiconductor layer 140.

Note that in the structures illustrated in FIG. 13A, a component, for example, the electrode 150*a*, the electrode 154*a*, or the like which the structure illustrated in FIGS. 2A and 2B or the like has can be omitted in some cases. Further, in the structures illustrated in FIG. 13B, a component, for example, the electrode 136*a*, the protective insulating layer 144, or the like which the structure illustrated in FIGS. 2A and 2B or the like has can be omitted in some cases. In such a case, simplification of the manufacturing process can be achieved secondarily. Needless to say, a component which is not essential can be omitted also in the structure illustrated in FIGS. 2A and 2B or the like.

Figure 14A:
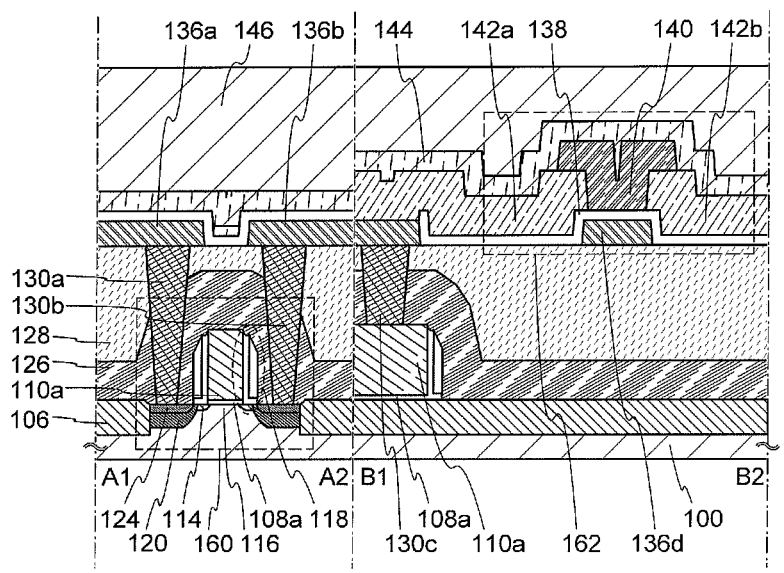
FIGS. 14A and 14B are each a cross-sectional view for illustrating a semiconductor device.
Figure 14B:
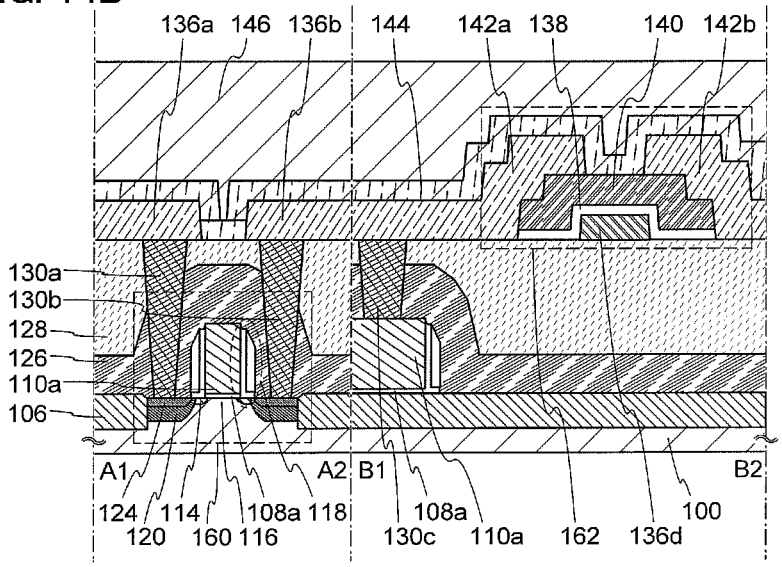

FIGS. 14A and 14B each illustrate an example of a structure in which the element has a relatively large size and the gate electrode 136*d* is provided under the oxide semiconductor layer 140. In this case, a wiring, an electrode, or the like does not need to be formed so as to be embedded in the insulating layer because flatness or coverage of a surface is not needed to be extremely high. For example, the gate electrode 136*d* and the like can be formed in such a manner that a conductive layer is formed and then patterned. Note that although not illustrated, the transistor 160 can be manufactured similarly.

A large difference between the structure illustrated in FIG. 14A and that illustrated in FIG. 14B is that which of the part of the bottom surface or the part of the top surface of the oxide semiconductor layer 140 the source and drain electrodes 142*a* and 142*b* are in contact with. In addition, resulting from this difference, a position of another electrode, another insulating layer, or the like is changed. The details of each component are the same as those of FIGS. 2A and 2B, and the like.

Specifically, in FIG. 14A, the transistor 162 includes: the gate electrode 136*d* provided over the interlayer insulating layer 128; the gate insulating layer 138 provided over the gate electrode 136*d*; the source or drain electrode 142*a* and the source or drain electrode 142*b* which are provided over the gate insulating layer 138; and the oxide semiconductor layer 140 in contact with the parts of the top surfaces of the source or drain electrode 142*a* and the source or drain electrode 142*b*.

In FIG. 14B, the transistor 162 includes: the gate electrode 136*d* provided over the interlayer insulating layer 128; the gate insulating layer 138 provided over the gate electrode 136*d*; the oxide semiconductor layer 140 over the gate insulating layer 138 which is provided in a region overlapping with the gate electrode 136*d*; and the source or drain electrode 142*a* and the source or drain electrode 142*b* which are provided in contact with the part of the top surface of the oxide semiconductor layer 140.

Note that also in the structures in FIGS. 14A and 14B, a component is sometimes omitted from the structure in FIGS. 2A and 2B or the like. Also in this case, simplification of the manufacturing process can be achieved.

Figure 15A:
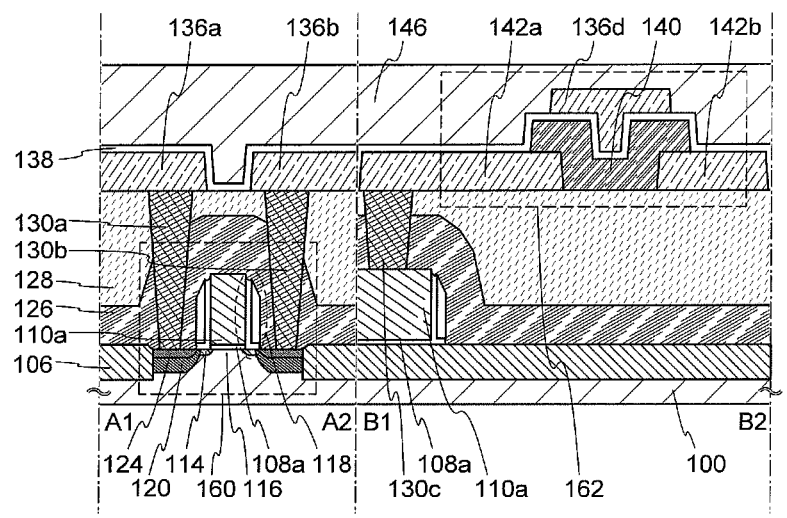
FIGS. 15A and 15B are each a cross-sectional view for illustrating a semiconductor device.
Figure 15B:
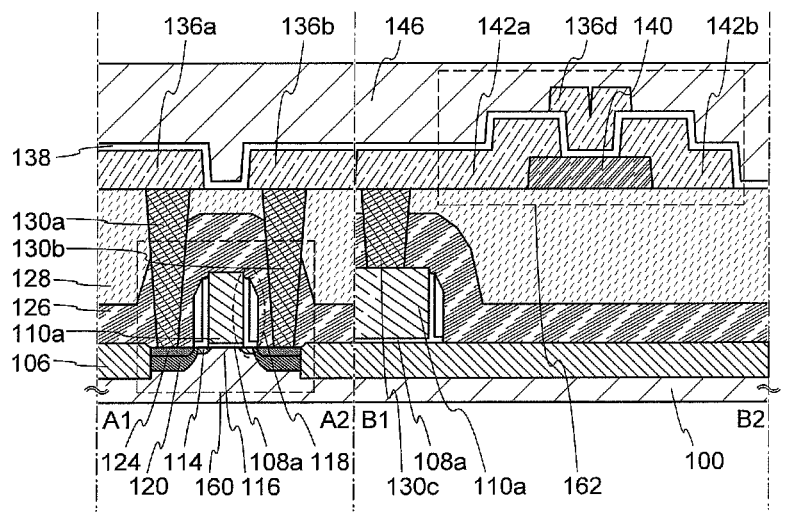

FIGS. 15A and 15B each illustrate an example of a structure in which the element has a relatively large size and the gate electrode 136*d* is provided over the oxide semiconductor layer 140. Also in this case, a wiring, an electrode, or the like does not need to be formed so as to be embedded in the insulating layer because flatness or coverage of a surface is not needed to be extremely high. For example, the gate electrode 136*d* and the like can be formed in such a manner that a conductive layer is formed and then patterned. Note that although not illustrated, the transistor 160 can be manufactured similarly.

A large difference between the structure illustrated in FIG. 15A and that illustrated in FIG. 15B is that which of the part of the bottom surface or the part of the top surface of the oxide semiconductor layer 140 the source and drain electrodes 142*a* and 142*b* are in contact with. In addition, resulting from this difference, a position of another electrode, another insulating layer, or the like is changed. The details of each component are the same as those of FIGS. 2A and 2B, and the like.

Specifically, in FIG. 15A, the transistor 162 includes: the source or drain electrode 142*a* and the source or drain electrode 142*b* which are provided over the interlayer insulating layer 128; the oxide semiconductor layer 140 which is in contact with the parts of the top surfaces of the source or drain electrode 142*a* and the source or drain electrode 142*b*; the gate insulating layer 138 provided over the source or drain electrode 142*a*, the source or drain electrode 142*b*, and the oxide semiconductor layer 140; and the gate electrode 136*d* over the gate insulating layer 138 which is provided in a region overlapping with the oxide semiconductor layer 140.

In FIG. 15B, the transistor 162 includes: the oxide semiconductor layer 140 provided over the interlayer insulating layer 128; the source or drain electrode 142*a* and the source or drain electrode 142*b* which are provided in contact with the part of the top surface of the oxide semiconductor layer 140; the gate insulating layer 138 provided over the source or drain electrode 142*a*, the source or drain electrode 142*b*, and the oxide semiconductor layer 140; and the gate electrode 136*d* over the gate insulating layer 138 which is provided in a region overlapping with the oxide semiconductor layer 140.

Note that also in the structures in FIGS. 15A and 15B, a component is sometimes omitted from the structure in FIGS. 2A and 2B or the like. Also in this case, simplification of the manufacturing process can be achieved.

As described above, according to one embodiment of the disclosed invention, a semiconductor device having a novel structure is realized. Although the transistor 160 and the transistor 162 are stacked in this embodiment, the structure of the semiconductor device is not limited thereto. Further, although an example in which the channel length direction of the transistor 160 and that of the transistor 162 are perpendicular to each other is described, the positions of the transistors 160 and 162 are not limited to this. In addition, the transistors 160 and 162 may be provided to overlap with each other.

Note that although in this embodiment a semiconductor device per minimum storage unit (one bit) is described for easy understanding, the structure of the semiconductor device is not limited to this. A more developed semiconductor device can be formed by appropriately connecting a plurality of semiconductor devices. For example, it is possible to make a NAND-type or NOR-type semiconductor device by using a plurality of the semiconductor devices. The structure of the wiring is not limited to that illustrated in FIG. 1 and can be changed as appropriate.

In the semiconductor device according to this embodiment, the small off-state current of the transistor 162 enables information to be held for an extremely long time. In other words, refreshing operation, which is needed in a DRAM or the like, is not necessary; thus, power consumption can be suppressed. In addition, the semiconductor device can be substantially used as a nonvolatile semiconductor device.

Since information is written by switching operation of the transistor 162, high voltage is not needed and an element is not deteriorated in the semiconductor device. Further, information is written or erased according to an on state and an off state of the transistor, whereby high-speed operation can be easily realized. In addition, it is also advantageous in that there is no need of operation for erasing information, which is necessary in a flash memory and the like.

In addition, the transistor using a material other than an oxide semiconductor can operate at sufficiently high speed; therefore, by using the transistor, stored data can be read out at high speed.

The structures, methods, and the like described in this embodiment can be combined as appropriate with any of the structures, methods, and the like described in the other embodiments.

Embodiment 2

In this embodiment, a circuit configuration of a memory cell, operation thereof, a circuit configuration of a semiconductor device using the memory cell, and operation thereof will be described.
<Structure of Memory Cell>

Figure 16:
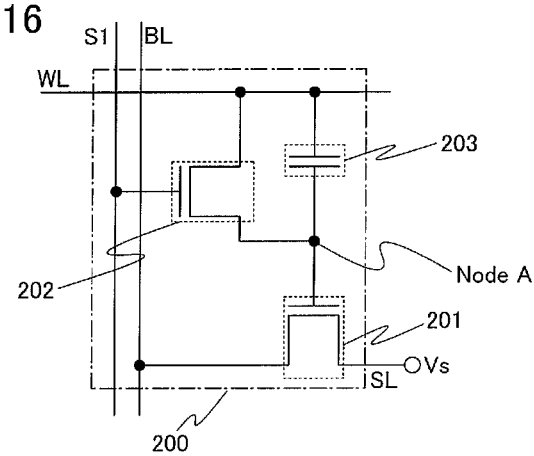
FIG. 16 is a circuit diagram for illustrating a memory element.

FIG. 16 illustrates an example of a circuit diagram of a memory cell included in the semiconductor device. A memory cell 200 illustrated in FIG. 16 includes a source line SL, a bit line BL, a signal line S1, a word line WL, a transistor 201 (a first transistor), a transistor 202 (a second transistor), and a capacitor 203. The transistor 201 is formed using a material other than an oxide semiconductor and the transistor 202 is formed using an oxide semiconductor.

Here, a gate electrode of the transistor 201, one of a source electrode and a drain electrode of the transistor 202, and one electrode of the capacitor 203 are electrically connected to one another. Further, the source line SL and one of a source electrode and a drain electrode of the transistor 201 are electrically connected to each other. The bit line BL and the other of the source electrode and the drain electrode of the transistor 201 are electrically connected to each other. The signal line S1 and the gate electrode of the transistor 202 are electrically connected to each other. The word line WL, the other of the source electrode and the drain electrode of the transistor 202, and the other electrode of the capacitor 203 are electrically connected to one another.
<Operation of Memory Cell>

Next, the operation of the memory cell will be described in detail.

When writing is performed on the memory cell 200, a potential of the source line SL is set to V0 (an arbitrary potential, e.g., 0 V), a potential of the bit line BL is set to V0, and the potential of the signal line S1 is set to V1 (an arbitrary potential, e.g., 2 V). At this time, the transistor 202 is turned on.

When a potential VWL of the word line WL is set to a predetermined potential in this state, data is written. For example, when data "1" is written, a potential of the word line WL is set to Vw_1, and when data "0" is written, the potential of the word line WL is set to Vw_0. Note that at the end of the writing, the potential of the signal line S1 is set to V0 before the potential of the word line WL is changed, so that the transistor 202 is turned off.

A charge QA corresponding to the potential of the word line WL at the time of writing is accumulated in a node (hereinafter referred to as a node A) connected to the gate electrode of the transistor 201; thus, data is stored. The off-state current of the transistor 202 is extremely small or substantially zero, so that the written data is held for a long time.

When the potential VWL of the word line WL is set to a predetermined potential, reading from the memory cell 200 is performed. For example, when reading from the memory cell 200 is performed, the potential of the source line SL is set to V0, the potential of the word line WL is set to Vr_1, the potential of the signal line S1 is set to V0, and a reading circuit connected to the bit line BL is set to operate. On the other hand, when reading from the memory cell 200 is not performed, the potential of the word line WL is set to Vr_0. At this time, the transistor 202 is turned off.

Next, a method for determining potentials Vw_0 and Vw_1 of the word lines for writing and potentials Vr_0 and Vr_1 of the word lines for reading is described.

Reading is performed by measuring a difference between resistance states of the memory cells 200, for example. When reading from the memory cells 200 is performed, the potential of the word line WL is set to Vr_1 as described above. It is preferable that in the case where data "1" is written in the memory cell 200 in this state, the transistor 201 be in an on state, and in the case where data "0" is written in the memory cell 200, the transistor 201 be in an off state.

A potential VA of the node A which determines the state of the transistor 201 depends on a capacitance C1 between the gate of the transistor 201 and the source (drain) of the transistor 201 and a capacitance C2 of the capacitor 203. With the use of the potential VWL (writing) of the word line WL at the time of writing and the potential VWL (reading) of the word line WL for reading, VA can be represented as follows:

$$VA = (C1 \cdot VWL(\text{writing}) + C2 \cdot VWL(\text{reading}))/(C1+C2)$$

In the memory cell 200 in which reading is selected, VWL (reading) is Vr_1, and in the memory cell 200 in which reading is not selected, VWL (reading) is Vr_0. Further, when data "1" is written, VWL (writing) is Vw_1, and when data "0" is written, VWL (writing) is Vw_0. That is, a potential of the node A in each state can be represented by the following equations. In the case where reading is selected and data "1" is written, the potential of the node A is represented as follows:

$$VA \approx (C1 \cdot Vw\_1 + C2 \cdot Vr\_1)/(C1+C2)$$

In the case where reading is selected and data "0" is written, the potential of the node A is represented as follows:

$$VA \approx (C1 \cdot Vw\_0 + C2 \cdot Vr\_1)/(C1+C2)$$

In the case where reading is not selected and data "1" is written, the potential of the node A is represented as follows:

$$VA \approx (C1 \cdot Vw\_1 + C2 \cdot Vr\_0)/(C1+C2)$$

In the case where reading is not selected and data "0" is written, the potential of the node A is represented as follows:

$$VA \approx (C1 \cdot Vw\_0 + C2 \cdot Vr\_0)/(C1+C2)$$

When reading is selected, in the case where data "1" is written, the transistor 201 needs to be in an on state. Therefore, the potential VA of the node A needs to be higher than a threshold voltage Vth of the transistor 201. In other words, the following formula is preferably satisfied:

$$VA \approx (C1 \cdot Vw\_1 + C2 \cdot Vr\_1)/(C1+C2) > Vth$$

When reading is selected, in the case where data "0" is written, it is preferable that the transistor 201 be in an off state and the potential VA of the node A be lower than the threshold voltage Vth of the transistor 201. In other words, the following formula is preferably satisfied:

$$VA \approx (C1 \cdot Vw\_0 + C2 \cdot Vr\_1)/(C1+C2) < Vth$$

When reading is not selected, even in the case where either data "1" or data "0" is written, it is necessary that the transistor 201 be in an on state. Therefore, the potential VA of the node A needs to be lower than the threshold voltage Vth of the transistor 201. In other words, the following formula is necessarily satisfied:

$$VA \approx (C1 \cdot Vw\_1 + C2 \cdot Vr\_0)/(C1+C2) < Vth$$

$$VA \approx (C1 \cdot Vw\_0 + C2 \cdot Vr\_0)/(C1+C2) < Vth$$

Vw_0, Vw_1, Vr_0, Vr_1, and the like are determined so as to satisfy the above relations, so that the memory cell 200 can operate. For example, in the case where the threshold voltage Vth of the transistor 201 is 1.7 (V) and C1/C2 is 1, the potentials can be set as follows: V0=0 (V), V1=2 (V), Vw_0=0 (V), Vw_1=2 (V), Vr_0=0 (V), and Vr_1=2 (V). Note that these potentials are only one example and can be changed as appropriate within the range satisfying the above conditions.

Here, under the condition of C1/C2<<1, the node A and the word line WL are strongly combined with each other; therefore, the potential of the word line WL and the potential of the node A are substantially the same regardless of whether the transistor 202 is in an on state or off state. Thus, even when writing is performed while the transistor 202 is turned on, a charge which the node A can accumulate is very little, the difference between data "0" and data "1" becomes small.

As a result, when reading is performed while the potential of the word line WL is Vr_1, even in the case where either data "0" or data "1" is written, the potential of the node A of the memory cell is increased, so that the transistor 201 is turned on. That is, it is difficult to read data.

On the other hand, under the condition of C1/C2>>1, the node A and the word line WL are weakly combined; therefore, the potential of the node A hardly changes even when the potential of the word line WL is changed. Thus, the potential of the node A capable of controlling an on state and off state of the transistor 201 is extremely limited and it is difficult to control an on state and off state of the transistor 201.

In other words, even when the potential of the word line WL is set to Vr_0, the potential of the node A is hardly decreased and the transistor 201 which has data "1" is in an on state.

Since there is a case where the operation becomes difficult depending on C1 and C2, it is necessary to pay attention when C1 and C2 are determined. Note that in the case where Vw_0 is 0 (V), Vw_1 is Vdd, Vr_0 is 0 (V), and Vr_1 is Vdd, the semiconductor device can operate sufficiently when C1/C2 is between Vth/(Vdd−Vth) and (Vdd−Vth)/Vth.

Note that distinction between data "1" and data "0" is only for convenience; therefore, data "1" and data "0" may be interchanged with each other. A ground potential GND or the like may be used as V0 and a power supply potential Vdd or the like may be used as V1.

<The Structure of the Semiconductor Device>

Figure 17:
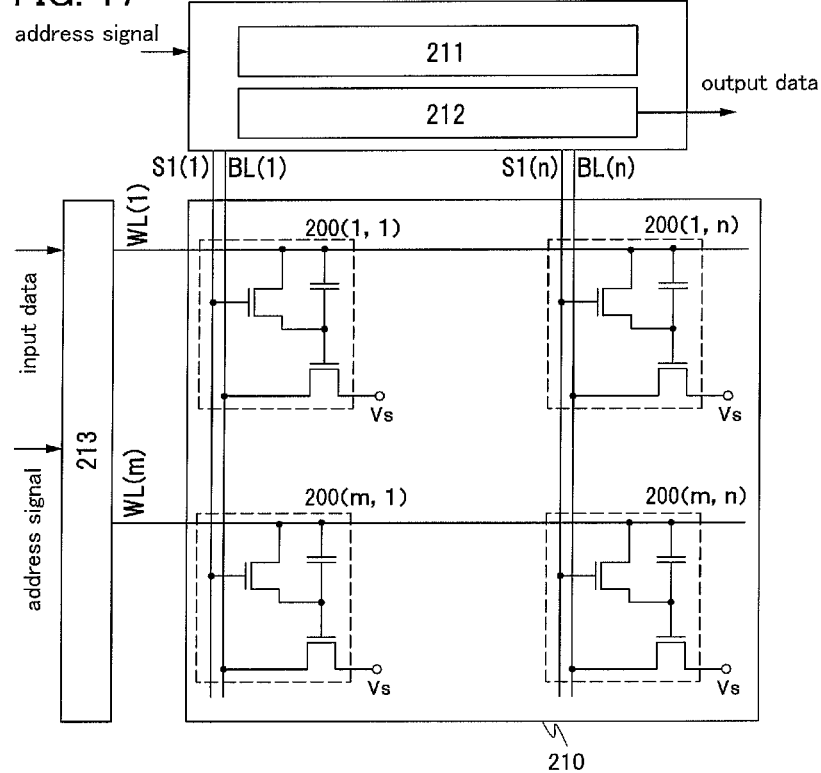
FIG. 17 is a circuit diagram for illustrating a semiconductor device.

FIG. 17 illustrates a block circuit diagram of a semiconductor device which includes m×n bits of storage capacity.

The semiconductor device includes in word lines, n bit lines, n signal lines, a memory cell array 210 in which a plurality of memory cells 200 (1, 1) to 200 (m, n) are provided in matrix of in rows (horizontal) and n columns (vertical) (m and n are natural numbers), and peripheral circuits such as a driver circuit 211 of the bit line and the signal line, a driver circuit 213 of the word line, and a reading circuit 212. A refresh circuit or the like may be provided as another peripheral circuit.

The memory cell 200 (i, j) (i is an integer greater than or equal to 1 and less than or equal to m, and j is an integer greater than or equal to 1 and less than or equal to n) is connected to the bit line BL(j), the signal line S1(j), the word line WL(i), and the source line SL. Further, the bit lines BL(1) to BL(n) and the signal lines S1(1) to S1(n) are connected to the driver circuit 211 of the bit lines BL and the signal lines S1. The word lines WL(1) to WL(m) are connected to the driver circuit 213 of the word lines WL. In addition, the bit lines BL(1) to BL(n) are also connected to the reading circuit 212. A potential Vs is supplied to the source line SL.

<Operation of Semiconductor Device>

The operation of the semiconductor device illustrated in FIG. 17 will be described. In this structure, writing is performed by column and reading is performed by row.

When writing is performed on the memory cells 200 (1, j) to 200 (m, j) in the j-th column, the potential of the source line SL is set to V0 (e.g., 0 V), the potential of the bit line BL(j) is set to V0, the potential of the signal line S1(j) is set to V1 (e.g., 2 V). At this time, the transistors 202 of the memory cells 200 (1, j) to 200 (m, j) are in an on state. In the other columns, the potential of the bit line is set to V0 and the potential of the signal line is set to V1. Note that the bit line BL(j) may be in a floating state.

When a potential VWL of the word line WL is set to a predetermined potential in this state, data is written. For example, when data "1" is written, a potential of the word line WL connected to the target memory cell is set to Vw_1, and when data "0" is written, the potential of the word line WL connected to the target memory cell is set to Vw_0. Note that at the end of the wiring, the potential of the signal line S1(j) is set to V0 before the potential of the word line WL is changed, so that the transistor 202 of the target memory cell is turned off.

After data is written, in the memory cell to which data "1" is written among the memory cells 200 (1, j) to 200 (m, j) in the j-th column, a potential VA0 of a node (hereinafter referred to as a node A) connected to the gate electrode of the transistor 201 is approximately C1·Vw_1/(C1+C2). In the memory cell to which data "0" is written, the potential of the node A is approximately $C_1 \cdot Vw\_0/(C_1+C_2)$. In the memory cells in the other columns, the potential of the node A is not changed.

Reading is performed by setting the potential VWL of the word line WL to a predetermined potential. When reading is performed on the memory cells 200 (i, 1) to 200 (i, n) in the i-th row, the potential of the source line SL is set to V0, the potential of the word line WL(i) is set to Vr_1, the potentials of the signal lines S1(1) to S1(n) are set to V0, and the reading circuit connected to the bit lines BL(1) to BL(n) is set to operate. In the other columns, the potentials of the words line WL are set to Vr_0.

The reading circuit can read data "0" and "1" by the difference between the resistance states of the memory cells, for example.

Since a method for determining Vw_0, Vw_1, Vr_0, and Vr_1 is the same as that in the case of <Operation of Memory Cell> described above, the description is omitted here. Further, relations of other potentials are also similar to those in the case of <Operation of Memory Cell> described above.

Note that distinction between data "1" and data "0" is only for convenience; therefore, data "1" and data "0" may be interchanged with each other.

A transistor using an oxide semiconductor has extremely small off-state current; therefore, by using the transistor, stored data can be held for quite a long time. That is, refreshing operation can become unnecessary or frequency of refreshing operation can be reduced considerably, so that power consumption can be reduced sufficiently. Further, even in the case where power is not supplied, stored data can be held for a long time.

In addition, high voltage is not needed to write information, and there is no problem of deterioration of elements. Further, information is written according to an on state and an off state of the transistor, whereby high-speed operation can be easily realized. Additionally, there is an advantage that operation for erasing information, which is necessary in a flash memory and the like, is not needed.

Since a transistor including a material other than an oxide semiconductor can operate at further high speed in comparison with a transistor including an oxide semiconductor, stored data can be read out at high speed by using the transistor.

The structures, methods, and the like described in this embodiment can be combined as appropriate with any of the structures, methods, and the like described in the other embodiments.

Embodiment 3

An example of the reading circuit 212 included in a semiconductor device according to one embodiment of the present invention will be described with reference to FIG. 18.

Figure 18:
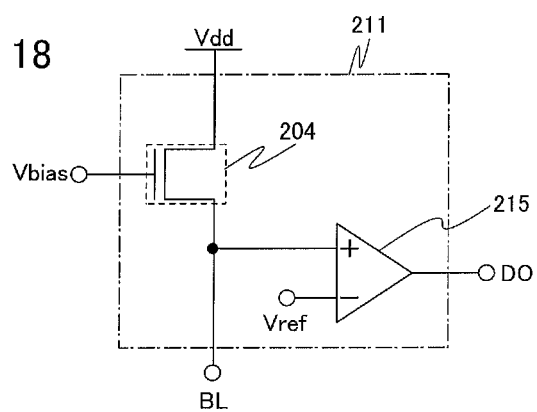
FIG. 18 is a circuit diagram for illustrating a reading circuit.

The reading circuit 212 illustrated in FIG. 18 includes a transistor 204 and a sense amplifier 215. A bias voltage $V_{bias}$ is applied to a gate electrode of the transistor 204, and a predetermined current flows through the transistor 204. A reference potential $V_{ref}$ is input to one input terminal of the sense amplifier 215.

When data is read, the other input terminal of the sense amplifier 215 and a bit line BL connected to a memory cell from which data is read are electrically connected to each other.

A memory cell has a different resistance corresponding to data "1" or data "0" stored therein. Specifically, when the transistor 201 in a selected memory cell is on, the memory cell has a low resistance; whereas when the transistor 201 in a selected memory cell is off, the memory cell has a high resistance.

When the memory cell has a high resistance, the potential of the other input terminal of the sense amplifier 215 is higher than a reference potential $V_{ref}$ and data "1" is output from an output terminal of the sense amplifier 215. On the other hand, when the memory cell has a low resistance, the potential of the other input terminal of the sense amplifier 215 is lower than the reference potential $V_{ref}$ and data "0" is output from the output terminal of the sense amplifier 215.

As described above, with the use of the reading circuit 212, data stored in a memory cell can be read. Note that the reading circuit 212 is merely an example, and a reading circuit having another configuration may be used. For example, the reading circuit 212 may include a precharge circuit.

The structures, methods, and the like described in this embodiment can be combined as appropriate with any of the structures, methods, and the like described in the other embodiments.

Embodiment 4

In this embodiment, a circuit configuration of a memory cell which is different from the memory cell described in any of the above embodiments and operation thereof will be described.

<Structure of Memory Cell>

Figure 19:
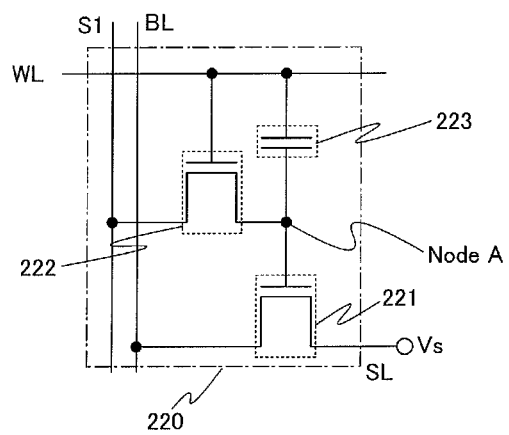
FIG. 19 is a circuit diagram for illustrating a memory element.

FIG. 19 illustrates an example of a circuit diagram of a memory cell according to this embodiment. A memory cell 220 illustrated in FIG. 19 includes a source line SL, a bit line BL, a signal line S1, a word line WL, a transistor 221 (a first transistor), a transistor 222 (a second transistor), and a capacitor 223. The transistor 221 is formed using a material other than an oxide semiconductor and the transistor 222 is formed using an oxide semiconductor.

Here, a gate electrode of the transistor 221, one of a source electrode and a drain electrode of the transistor 222, and one electrode of the capacitor 223 are electrically connected to one another. Further, the source line SL and one of a source electrode and a drain electrode of the transistor 221 are electrically connected to each other. The bit line BL and the other of the source electrode and the drain electrode of the transistor 221 are electrically connected to each other. The signal line S1 and the other of the source electrode and the drain electrode of the transistor 222 are electrically connected to each other. The word line WL, a gate electrode of the transistor 222, and the other electrode of the capacitor 223 are electrically connected to one another.

<Operation of Memory Cell>

Next, the operation of the memory cell will be described in detail.

When writing is performed on the memory cell 220, a potential of the source line SL is set to V0 (an arbitrary potential, e.g., 0 V), a potential of the bit line BL is set to V0, and a potential of the word line WL is set to V1 (an arbitrary potential, e.g., 2 V). At this time, the transistor 222 is turned on.

When a potential VS1 of the signal line S1 is set to a predetermined potential in this state, data is written. For example, when data "1" is written, a potential of the signal line S1 is set to Vw_1, and when data "0" is written, the potential of the signal line S1 is set to Vw_0. Note that at the end of the writing, the potential of the word line WL is set to V0 before the potential of the signal line S1 is changed, so that the transistor 222 is turned off.

A charge QA corresponding to the potential of the signal line S1 at the time of writing is accumulated in a node (hereinafter referred to as a node A) connected to the gate electrode of the transistor 221; thus, data is stored. The off-state current of the transistor 222 is extremely small or substantially zero, so that the written data is held for a long time.

When a potential VWL of the word line WL is set to a predetermined potential, reading from the memory cell 220 is performed. For example, when reading from the memory cell 220 is performed, the potential of the source line SL is set to V0, the potential of the word line WL is set to $Vr\_1$, the potential of the signal line S1 is set to V1, and a reading circuit connected to the bit line BL is set to operate. On the other hand, when reading from the memory cell 220 is not performed, the potential of the word line WL is set to $Vr\_0$. At this time, the transistor 222 is turned off.

The potentials $Vw\_1$ and $Vw\_0$ of the signal lines S1 at the time of writing and the potentials $Vr\_1$ and $Vr\_0$ of the word lines WL for reading are set such that when the potential of the word line WL is $Vr\_1$, the transistor 221 of the memory cell 220 in which data "1" is stored is turned on and the transistor 221 of the memory cell 220 in which data "0" is stored is turned off. Further, the potentials $Vw\_1$ and $Vw\_0$ and the potentials $Vr\_1$ and $Vr\_0$ are set such that the transistor 222 is in an off state. Furthermore, when the potential of the word line WL is set to $Vr\_0$, regardless of either data "0" or data "1" is stored, the transistor 221 is turned off and the transistor 222 is turned off in the memory cell 220.

In the case where a NOR-type nonvolatile memory is formed using the memory cell 220, with the use of the potential having the above relation, the memory cell 220 which is selected for reading can have different resistance depending on stored data, and the memory cell 220 which is not selected for reading can have high resistance regardless of stored data. As a result, with the use of a reading circuit which detects a difference between resistance states of the bit lines, data in the memory cell 220 can be read.

Note that distinction between data "1" and data "0" is only for convenience; therefore, data "1" and data "0" may be interchanged with each other. A ground potential GND or the like may be used as V0 and a power supply potential Vdd or the like may be used as V1.

Note that in the case where the memory cell 220 in this embodiment is used, a semiconductor device having a matrix structure can be realized. The semiconductor device having a matrix structure can be realized by using a circuit having a structure similar to the structure described in any of the above embodiments and by forming a driver circuit, a reading circuit, and a writing circuit in accordance with a structure of a signal line. Note that in the case where the memory cell 220 is used, reading and writing are performed by row.

The structures, methods, and the like described in this embodiment can be combined as appropriate with any of the structures, methods, and the like described in the other embodiments.

Embodiment 5

In this embodiment, examples of an electronic appliance in which the semiconductor device obtained according to any of the above embodiments is mounted are described with reference to FIGS. 20A to 20F. The semiconductor device obtained according to any of the above embodiments can hold information even without supply of power. In addition, degradation incident to writing and erasing is not caused. Further, operation speed thereof is high. Thus, with the use of the semiconductor device, an electronic appliance having a novel structure can be provided. Note that the semiconductor device according to any of the above embodiments is integrated and mounted on a circuit board or the like to be mounted on an electronic appliance.

Figure 20A:
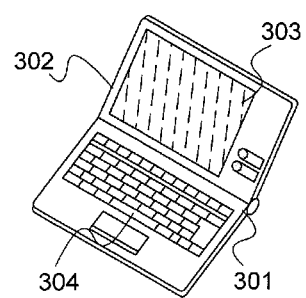
FIGS. 20A to 20F are each a diagram for illustrating an electronic appliance.

FIG. 20A illustrates a laptop personal computer which includes in the semiconductor device according to any of the above embodiments and includes a main body 301, a housing 302, a display portion 303, a keyboard 304, and the like. When the semiconductor device according to an embodiment of the present invention is applied to the laptop personal computer, information can be held even without supply of power. In addition, degradation incident to writing and erasing is not caused. Further, operation speed thereof is high. Thus, it is preferable that the semiconductor device according to an embodiment of the present invention be applied to the laptop personal computer.

Figure 20D:
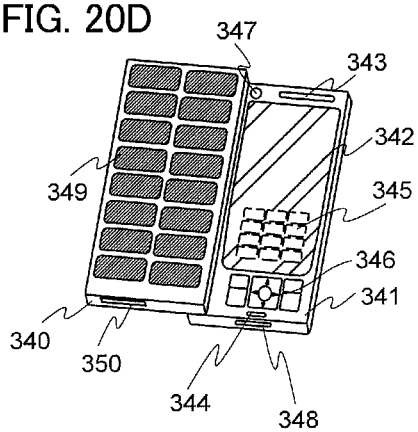
Figure 20B:
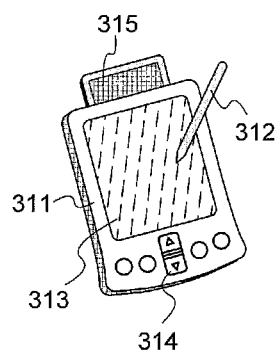

FIG. 20B illustrates a portable information terminal (PDA) which includes the semiconductor device according to any of the above embodiments and is provided with a main body 311 including a display portion 313, an external interface 315, an operation button 314, and the like. In addition, a stylus 312 is included as an accessory for operation. When the semiconductor device according to an embodiment of the present invention is applied to the PDA, information can be held even without supply of power. In addition, degradation incident to writing and erasing is not caused. Further, operation speed thereof is high. Thus, it is preferable that the semiconductor device according to an embodiment of the present invention be applied to the PDA.

Figure 20E:
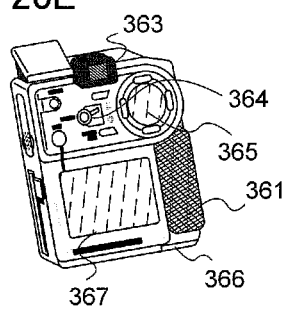
Figure 20C:
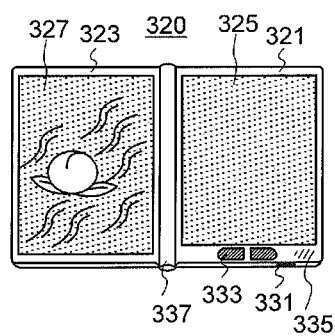

FIG. 20C illustrates an e-book reader 320 as an example of electronic paper including the semiconductor device according to any of the above embodiments. The e-book reader 320 includes two housings, a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. When the semiconductor device according to an embodiment of the present invention is applied to the electronic paper, information can be held even without supply of power. In addition, degradation incident to writing and erasing is not caused. Further, operation speed thereof is high. Thus, it is preferable that the semiconductor device according to an embodiment of the present invention be applied to the electronic paper.

A display portion 325 is incorporated in the housing 321 and a display portion 327 is incorporated in the housing 323. The display portion 325 and the display portion 327 may display one image, or may display different images. When the display portions 325 and 327 display different images, for example, a display portion on the right side (the display portion 325 in FIG. 20C) can display text and a display portion on the left side (the display portion 327 in FIG. 20C) can display graphics.

FIG. 20C illustrates an example in which the housing 321 is provided with an operation portion and the like. For example, the housing 321 is provided with a power button 331, operation keys 333, a speaker 335, and the like. Pages can be turned with the operation keys 333. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 320 may have a function of an electronic dictionary.

The e-book reader 320 may be configured to transmit and receive information wirelessly. Through wireless communication, desired book data or the like can be purchased and downloaded from an e-book server.

Note that the electronic paper can be applied to an electronic appliance in any field which can display information. For example, the electronic paper can be used for posters, advertisements in vehicles such as trains, display in a variety of cards such as credit cards, and the like in addition to e-book readers.

FIG. 20D illustrates a mobile phone including the semiconductor device according to any of the above embodiments. The mobile phone includes two housings, the housing 340 and the housing 341. The housing 341 includes a display panel 342, a speaker 343, a microphone 344, a pointing device 346, a camera lens 347, an external connection terminal 348, and the like. The housing 340 includes a solar cell 349 for charging the mobile phone, an external memory slot 350, and the like. In addition, an antenna is incorporated in the housing 341. When the semiconductor device according to an embodiment of the present invention is applied to the mobile phone, information can be held even without supply of power. In addition, degradation incident to writing and erasing is not caused. Further, operation speed thereof is high. Thus, it is preferable that the semiconductor device according to an embodiment of the present invention be applied to the mobile phone.

The display panel 342 is provided with a touch panel function. A plurality of operation keys 345 which are displayed as images is illustrated by dashed lines in FIG. 20D. Note that the mobile phone includes a boosting circuit for raising a voltage output from the solar cell 349 to a voltage which is necessary for each circuit. Further, in addition to the above structure, a structure in which a noncontact IC chip, a small recording device, or the like is incorporated may be employed.

A display direction of the display panel 342 is appropriately changed in accordance with the usage mode. Further, the camera lens 347 is provided on the same surface as the display panel 342, and thus it can be used as a video phone. The speaker 343 and the microphone 344 can be used for videophone, recording, playback, and the like without being limited to verbal communication. Moreover, the housings 340 and 341 in a state where they are developed as illustrated in FIG. 20D can be slid so that one is lapped over the other; therefore, the size of the mobile phone can be reduced, which makes the mobile phone suitable for being carried.

The external connection terminal 348 can be connected to various kinds of cables such as an AC adapter or a USB cable, which enables charging and data communication. Moreover, by inserting a recording medium into the external memory slot 350, the mobile phone can deal with storing and moving a large capacity of data. Further, in addition to the above functions, an infrared communication function, a television reception function, or the like may be provided.

FIG. 20E illustrates a digital camera including the semiconductor device according to any of the above embodiments. The digital camera includes a main body 361, a display portion (A) 367, an eyepiece 363, an operation switch 364, a display portion (B) 365, a battery 366, and the like. When the semiconductor device according to an embodiment of the present invention is applied to the digital camera, information can be held even without supply of power. In addition, degradation incident to writing and erasing is not caused. Further, operation speed thereof is high. Thus, it is preferable that the semiconductor device according to an embodiment of the present invention be applied to the digital camera.

Figure 20F:
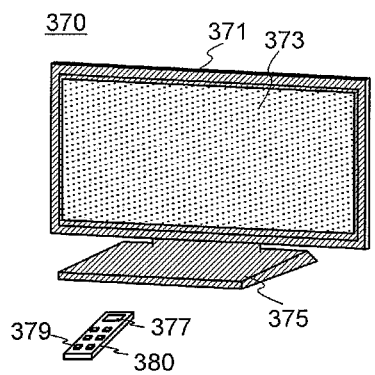

FIG. 20F illustrates a television set including the semiconductor device according to any of the above embodiments. In the television set 370, a display portion 373 is incorporated in a housing 371. The display portion 373 can display an image. Here, the housing 371 is supported by a stand 375.

The television set 370 can be operated by an operation switch of the housing 371 or a separate remote controller 380. Channels and volume can be controlled by an operation key 379 of the remote controller 380 so that an image displayed on the display portion 373 can be controlled. Furthermore, the remote controller 380 may be provided with a display portion 377 for displaying information output from the remote controller 380. When the semiconductor device according to an embodiment of the present invention is applied to the television set, information can be held even without supply of power. In addition, degradation incident to writing and erasing is not caused. Further, operation speed thereof is high. Thus, it is preferable that the semiconductor device according to an embodiment of the present invention be applied to the television set.

Note that the television set 370 is preferably provided with a receiver, a modem, and the like. With the receiver, a general television broadcast can be received. Furthermore, when the television set 370 is connected to a communication network by wired or wireless connection via the modem, one-way (from a transmitter to a receiver) or two-way (between a transmitter and a receiver, between receivers, or the like) information communication can be performed.

The structures, methods, and the like described in this embodiment can be combined as appropriate with any of the structures, methods, and the like described in the other embodiments.

This application is based on Japanese Patent Application serial no. 2009-264552 filed with Japan Patent Office on Nov. 20, 2009, the entire contents of which are hereby incorporated by reference.

The invention claimed is:

1. A semiconductor device comprising:
a source line;
a bit line;
a signal line; and
a word line,
wherein a plurality of memory cells are connected in parallel between the source line and the bit line,
wherein one of the plurality of memory cells comprises a first transistor comprising a first gate electrode, a first source electrode, and a first drain electrode, a second transistor comprising a second gate electrode, a second source electrode, and a second drain electrode, and a capacitor,
wherein the first transistor is provided in a substrate containing a semiconductor material,
wherein the second transistor comprises an oxide semiconductor layer,
wherein the first gate electrode, one of the second source electrode and the second drain electrode, and one electrode of the capacitor are electrically connected to one another,
wherein the source line and one of the first source electrode and the first drain electrode are electrically connected to each other,
wherein the bit line and the other of the first source electrode and the first drain electrode are electrically connected to each other, and wherein the word line, the other of the second source electrode and the second drain electrode, and the other electrode of the capacitor are electrically connected to one another.

2. The semiconductor device according to claim 1, wherein the signal line and the second gate electrode are electrically connected to each other.

3. The semiconductor device according to claim 1, wherein the second transistor comprises the second gate electrode over the substrate containing the semiconductor material, a second gate insulating layer over the second gate electrode, the oxide semiconductor layer over the second gate insulating layer, and the second source electrode and the second drain electrode which are electrically connected to the oxide semiconductor layer.

4. The semiconductor device according to claim 1, wherein the substrate containing the semiconductor material is a single crystal semiconductor substrate or an SOI substrate.

5. The semiconductor device according to claim 1, wherein the semiconductor material is silicon.

6. The semiconductor device according to claim 1, wherein the oxide semiconductor layer comprises an In—Ga—Zn—O-based oxide semiconductor material.

7. The semiconductor device according to claim 1, wherein the oxide semiconductor layer contains a crystal of $In_2Ga_2ZnO_7$.

8. The semiconductor device according to claim 1, wherein hydrogen concentration of the oxide semiconductor layer is less than or equal to $5\times10^{19}$ atoms/cm$^3$.

9. The semiconductor device according to claim 1, wherein off-state current of the second transistor is less than or equal to $1\times10^{-13}$ A.

10. A semiconductor device comprising:
   a source line;
   a bit line;
   a signal line;
   a word line;
   a first selection line;
   a second selection line;
   a third transistor which is electrically connected to the first selection line in a third gate electrode; and
   a fourth transistor which is electrically connected to the second selection line in a fourth gate electrode,
   wherein a plurality of memory cells are connected in parallel between the source line and the bit line,
   wherein one of the plurality of memory cells comprises a first transistor comprising a first gate electrode, a first source electrode, and a first drain electrode, a second transistor comprising a second gate electrode, a second source electrode, and a second drain electrode, and a capacitor,
   wherein the first transistor is provided in a substrate containing a semiconductor material,
   wherein the second transistor comprises an oxide semiconductor layer,
   wherein the first gate electrode, one of the second source electrode and the second drain electrode, and one electrode of the capacitor are electrically connected to one another,
   wherein the source line and one of the first source electrode and the first drain electrode are electrically connected to each other through the fourth transistor,
   wherein the bit line and the other of the first source electrode and the first drain electrode are electrically connected to each other through the third transistor, and
   wherein the word line, the other of the second source electrode and the second drain electrode, and the other electrode of the capacitor are electrically connected to one another.

11. The semiconductor device according to claim 10, wherein the signal line and the second gate electrode are electrically connected to each other.

12. The semiconductor device according to claim 10, wherein the second transistor comprises the second gate electrode over the substrate containing the semiconductor material, a second gate insulating layer over the second gate electrode, the oxide semiconductor layer over the second gate insulating layer, and the second source electrode and the second drain electrode which are electrically connected to the oxide semiconductor layer.

13. The semiconductor device according to claim 10, wherein the substrate containing the semiconductor material is a single crystal semiconductor substrate or an SOI substrate.

14. The semiconductor device according to claim 10, wherein the semiconductor material is silicon.

15. The semiconductor device according to claim 10, wherein the oxide semiconductor layer comprises an In—Ga—Zn—O-based oxide semiconductor material.

16. The semiconductor device according to claim 10, wherein the oxide semiconductor layer contains a crystal of $In_2Ga_2ZnO_7$.

17. The semiconductor device according to claim 10, wherein hydrogen concentration of the oxide semiconductor layer is less than or equal to $5\times10^{19}$ atoms/cm$^3$.

18. The semiconductor device according to claim 10, wherein off-state current of the second transistor is less than or equal to $1\times10^{-13}$ A.

19. A semiconductor device comprising:
   a source line;
   a bit line;
   a signal line; and
   a word line,
   wherein a plurality of memory cells are connected in parallel between the source line and the bit line,
   wherein one of the plurality of memory cells comprises a first transistor comprising a first gate electrode, a first source electrode, and a first drain electrode, a second transistor comprising a second gate electrode, a second source electrode, and a second drain electrode, and a capacitor,
   wherein the first transistor is provided in a substrate containing a semiconductor material,
   wherein the second transistor comprises an oxide semiconductor layer,
   wherein the first gate electrode, one of the second source electrode and the second drain electrode, and one electrode of the capacitor are electrically connected to one another,
   wherein the source line and one of the first source electrode and the first drain electrode are electrically connected to each other,
   wherein the bit line and the other of the first source electrode and the first drain electrode are electrically connected to each other,
   wherein the word line, the other of the second source electrode and the second drain electrode, and the other electrode of the capacitor are electrically connected to one another, and
   wherein the first transistor comprises a channel formation region provided in the substrate containing the semiconductor material, impurity regions provided so as to interpose the channel formation region, a first gate insulating layer over the channel formation region, the first gate electrode over the first gate insulating layer, and the first source electrode and the first drain electrode which are electrically connected to the impurity regions.

20. The semiconductor device according to claim 19, wherein the signal line and the second gate electrode are electrically connected to each other.

21. The semiconductor device according to claim 19, wherein the second transistor comprises the second gate electrode over the substrate containing the semiconductor material, a second gate insulating layer over the second gate electrode, the oxide semiconductor layer over the second gate insulating layer, and the second source electrode and the second drain electrode which are electrically connected to the oxide semiconductor layer.

22. The semiconductor device according to claim 19, wherein the substrate containing the semiconductor material is a single crystal semiconductor substrate or an SOI substrate.

23. The semiconductor device according to claim 19, wherein the semiconductor material is silicon.

24. The semiconductor device according to claim 19, wherein the oxide semiconductor layer comprises an In—Ga—Zn—O-based oxide semiconductor material.

25. The semiconductor device according to claim 19, wherein the oxide semiconductor layer contains a crystal of $In_2Ga_2ZnO_7$.

26. The semiconductor device according to claim 19, wherein hydrogen concentration of the oxide semiconductor layer is less than or equal to $5 \times 10^{19}$ atoms/cm$^3$.

27. The semiconductor device according to claim 19, wherein off-state current of the second transistor is less than or equal to $1 \times 10^{-13}$ A.

28. A semiconductor device comprising:
   a source line;
   a bit line;
   a signal line;
   a word line;
   a first selection line;
   a second selection line;
   a third transistor which is electrically connected to the first selection line in a third gate electrode; and
   a fourth transistor which is electrically connected to the second selection line in a fourth gate electrode,
   wherein a plurality of memory cells are connected in parallel between the source line and the bit line,
   wherein one of the plurality of memory cells comprises a first transistor comprising a first gate electrode, a first source electrode, and a first drain electrode, a second transistor comprising a second gate electrode, a second source electrode, and a second drain electrode, and a capacitor,
   wherein the first transistor is provided in a substrate containing a semiconductor material,
   wherein the second transistor comprises an oxide semiconductor layer,
   wherein the first gate electrode, one of the second source electrode and the second drain electrode, and one electrode of the capacitor are electrically connected to one another,
   wherein the source line and one of the first source electrode and the first drain electrode are electrically connected to each other through the fourth transistor,
   wherein the bit line and the other of the first source electrode and the first drain electrode are electrically connected to each other through the third transistor,
   wherein the word line, the other of the second source electrode and the second drain electrode, and the other electrode of the capacitor are electrically connected to one another, and
   wherein the first transistor comprises a channel formation region provided in the substrate containing the semiconductor material, impurity regions provided so as to interpose the channel formation region, a first gate insulating layer over the channel formation region, the first gate electrode over the first gate insulating layer, and the first source electrode and the first drain electrode which are electrically connected to the impurity regions.

29. The semiconductor device according to claim 28, wherein the signal line and the second gate electrode are electrically connected to each other.

30. The semiconductor device according to claim 28, wherein the second transistor comprises the second gate electrode over the substrate containing the semiconductor material, a second gate insulating layer over the second gate electrode, the oxide semiconductor layer over the second gate insulating layer, and the second source electrode and the second drain electrode which are electrically connected to the oxide semiconductor layer.

31. The semiconductor device according to claim 28, wherein the substrate containing the semiconductor material is a single crystal semiconductor substrate or an SOI substrate.

32. The semiconductor device according to claim 28, wherein the semiconductor material is silicon.

33. The semiconductor device according to claim 28, wherein the oxide semiconductor layer comprises an In—Ga—Zn—O-based oxide semiconductor material.

34. The semiconductor device according to claim 28, wherein the oxide semiconductor layer contains a crystal of $In_2Ga_2ZnO_7$.

35. The semiconductor device according to claim 28, wherein hydrogen concentration of the oxide semiconductor layer is less than or equal to $5 \times 10^{19}$ atoms/cm$^3$.

36. The semiconductor device according to claim 28, wherein off-state current of the second transistor is less than or equal to $1 \times 10^{-13}$ A.

* * * * *